United States Patent
Kanda

(10) Patent No.: US 12,142,677 B2
(45) Date of Patent: Nov. 12, 2024

(54) SEMICONDUCTOR DEVICE

(71) Applicant: Nuvoton Technology Corporation Japan, Kyoto (JP)

(72) Inventor: Yusuke Kanda, Toyama (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 0 days.

(21) Appl. No.: 18/578,607

(22) PCT Filed: Jul. 21, 2022

(86) PCT No.: PCT/JP2022/028359
§ 371 (c)(1),
(2) Date: Jan. 11, 2024

(87) PCT Pub. No.: WO2023/008308
PCT Pub. Date: Feb. 2, 2023

(65) Prior Publication Data
US 2024/0266428 A1 Aug. 8, 2024

(30) Foreign Application Priority Data
Jul. 27, 2021 (JP) .................................. 2021-122144

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/2003* (2013.01); *H01L 29/402* (2013.01);
(Continued)

(58) Field of Classification Search
CPC ............. H01L 29/7787; H01L 29/7786; H01L 29/7788
See application file for complete search history.

(56) References Cited

U.S. PATENT DOCUMENTS

2005/0151255 A1 7/2005 Ando et al.
2006/0145201 A1 7/2006 Shiga
(Continued)

FOREIGN PATENT DOCUMENTS

JP 2006-190749 A 7/2006
JP 4221697 B2 2/2009
(Continued)

OTHER PUBLICATIONS

International Search Report dated Oct. 11, 2022 issued in International Patent Application No. PCT/JP2022/028359, with English translation.
(Continued)

Primary Examiner — Grant S Withers
(74) Attorney, Agent, or Firm — Rimon P.C.

(57) ABSTRACT

A semiconductor device includes: a first nitride semiconductor layer; a second nitride semiconductor layer; a source electrode and a drain electrode; and a gate electrode that is spaced apart from the source electrode and the drain electrode, and is in contact with the second nitride semiconductor layer. The gate electrode includes: a first barrier layer that includes TaN, has a layer thickness of Z1, and forms a Schottky junction with the second nitride semiconductor layer; a second barrier layer that is disposed above and in contact with the first barrier layer, includes TiN or WN, and has a layer thickness of Z2; and a wiring layer disposed above and in contact with the second barrier layer. In the semiconductor device, 200 nm≥Z1+Z2≥50 nm, Z1<Z2, and 50 nm>Z1>3 nm are satisfied.

20 Claims, 29 Drawing Sheets

(51) Int. Cl.
  *H01L 29/40* (2006.01)
  *H01L 29/423* (2006.01)
  *H01L 29/47* (2006.01)

(52) U.S. Cl.
  CPC ...... *H01L 29/42316* (2013.01); *H01L 29/475* (2013.01); *H01L 29/7787* (2013.01)

(56) References Cited

U.S. PATENT DOCUMENTS

| | | |
|---|---|---|
| 2006/0157735 A1 | 7/2006 | Kanamura et al. |
| 2008/0185613 A1 | 8/2008 | Beach et al. |
| 2010/0176421 A1 | 7/2010 | Van Hove et al. |
| 2010/0258843 A1 | 10/2010 | Lidow et al. |
| 2013/0248873 A1 | 9/2013 | Kuraguchi et al. |
| 2014/0092636 A1 | 4/2014 | Kanamura et al. |
| 2014/0106516 A1 | 4/2014 | Curatola et al. |
| 2015/0123169 A1 | 5/2015 | Tiku et al. |
| 2017/0317183 A1* | 11/2017 | Kato ................ H01L 21/28264 |
| 2020/0051823 A1 | 2/2020 | Iucolano et al. |

FOREIGN PATENT DOCUMENTS

| | | |
|---|---|---|
| JP | 2010-517302 A | 5/2010 |
| JP | 2010-533987 A | 10/2010 |
| JP | 4866007 B2 | 2/2012 |
| JP | 2012-523697 A | 10/2012 |
| JP | 2013-201370 A | 10/2013 |
| JP | 2014-072388 A | 4/2014 |
| JP | 2014-099523 A | 5/2014 |
| WO | 2008/097551 A1 | 8/2008 |
| WO | 2009/012536 A1 | 1/2009 |
| WO | 2010/118087 A1 | 10/2010 |

OTHER PUBLICATIONS

Written Opinion of the International Searching Authority dated Oct. 11, 2022 issued in International Patent Application No. PCT/JP2022/028359, with English translation.

Extended European Search Report dated Aug. 5, 2024 issued in the corresponding European Patent Application No. 22849370.6.

* cited by examiner

SEMICONDUCTOR DEVICE

CROSS-REFERENCE OF RELATED APPLICATIONS

This application is the U.S. National Phase under 35 U.S.C. § 371 of International Patent Application No. PCT/JP2022/028359, filed on Jul. 21, 2022, which in turn claims the benefit of Japanese Patent Application No. 2021-122144, filed on Jul. 27, 2021, the entire disclosures of which Applications are incorporated by reference herein.

TECHNICAL FIELD

The present disclosure relates to semiconductor devices, and in particular to a group III nitride semiconductor device including a group III nitride semiconductor.

BACKGROUND ART

Group III nitride semiconductor devices, in particular, the group III nitride semiconductors using gallium nitride (GaN) or aluminum gallium nitride (AlGaN) have high dielectric breakdown voltages due to the wide bandgap of the materials. In addition, with the group III nitride semiconductor devices, a hetero structure such as AlGaN/GaN is easily formed.

With the AlGaN/GaN hetero structure, due to the piezoelectric polarization generated by the difference in lattice constants between the materials and the spontaneous polarization of AlGaN and GaN, a channel including high-concentration electrons (hereinafter referred to as a "two-dimensional electron gas layer") is formed on the GaN layer side of the AlGaN/GaN interface. The group III nitride semiconductor devices including the channels of the above-described two-dimensional electron gas layer have a relatively high electron saturation velocity, relatively high insulation resistance, and relatively high thermal conductivity, and thus are applied to high-frequency power devices. In addition, it is necessary to use an electrode forming a Schottky junction with AlGaN, as the gate electrode.

In order to enhance the characteristics of the above-described group III nitride semiconductor devices, it is necessary for the gate electrode to reduce electrode deterioration and reverse leakage current during a high temperature operation. For that reason, a material with a high melting point and high work function, for example, is used for the gate electrode. As a result of use of this material, for example, the thermal resistance of the gate electrode and the Schottky barrier height are made as high as possible. In the above-described manner, electrode deterioration and reverse leakage current during a high temperature operation are reduced, and thus it is possible to enhance the reliability.

In addition, it is necessary to reduce a phenomenon called current collapse which is a unique problem for group III nitride semiconductor devices. The current collapse is a phenomenon in which the on-resistance increases as a result of high-current and high-voltage stress being applied. This phenomenon occurs when electrons accelerated by high-voltage stress are trapped by crystal defects inside the group III nitride semiconductor device and by a level present at the film interface.

Patent Literature (PTL) 1 discloses a semiconductor device including a tantalum nitride (TaN) layer having a natrium chloride (NaCl) structure with an N/Ta ratio=1.00 which has been deposited by sputtering method with a high melting point, above an n-type GaN layer in the +c-plane direction (<0001> direction), and the n-type GaN layer and the TaN layer form a Schottky junction with each other. With this configuration, TaN having the NaCl structure with an N/Ta ratio=1.00 not only has a high work function of 5.4 eV as a material, but also has a maximum work function due to the small difference in lattice constant in the a-axis direction with the n-type GaN layer, i.e., the Schottky barrier is maximum. For that reason, it is possible to obtain a highly reliable gate electrode with high thermal resistance and a high Schottky barrier.

FIG. 29 is a cross-sectional view illustrating a configuration in proximity to the gate electrode of the semiconductor device (group III nitride semiconductor device) according to PTL 2. As illustrated in FIG. 29, the semiconductor device according to PTL 2 includes buffer layer 102, GaN layer 103a, and AlGaN layer 104a in stated order above substrate 101. This semiconductor device includes two-dimensional electron gas layer 105 on the GaN layer 103a side resulting from the hetero structure. In addition, first insulating layer 211 is provided above AlGaN layer 104a, and first opening portion 211a is provided in first insulating layer 211 by removing a portion of first insulating layer 211 such that AlGaN layer 104a is exposed. Furthermore, gate insulating layer 204 provided to cover a top of first insulating layer 211 and first opening portion 211a, and TaN layer 411a provided above gate insulating layer 204 to cover first opening portion 211a are included. Second insulating layer 212 is provided to cover a top of gate insulating layer 204 and a top of TaN layer 411a, and second opening portion 212b is provided in second insulating layer 212 by removing a portion of second insulating layer 212 such that a portion of TaN layer 411a is exposed. Titanium nitride layer (TiN layer 411b) and first wiring layer 411c are stacked in sequence to cover second opening portion 212b. In other words, this semiconductor device includes gate electrode 411 including TaN layer 411a, TiN layer 411b, and first wiring layer 411c. The semiconductor device according to PTL 2 has a metal-insulator-semiconductor (MIS) structure including gate insulating layer 204, but it may also be used as a semiconductor device having a metal-semiconductor (MES) structure. In this case, with the semiconductor device according to PTL 2, it is possible to obtain a highly reliable gate electrode with high thermal resistance and a high Schottky barrier as described in PTL 1, even if TaN layer 411a and AlGaN layer 104a form a Schottky junction with each other.

CITATION LIST

Patent Literature

[PTL 1] Japanese Unexamined Patent Application Publication No. 2006-190749

[PTL 2] Japanese Unexamined Patent Application Publication No. 2013-201370

SUMMARY OF INVENTION

Technical Problem

According to the above-described PTL 2, gate electrode 411 including TaN layer 411a, TiN layer 411b, and first wiring layer 411c is provided. With the method described in PTL 2, when metal atoms of first wiring layer 411c diffuse into AlGaN layer 104a or first insulating layer 211 due to thermal history during the manufacturing process, a level is generated. The generated level, for example, decreases the Schottky barrier height or increases the on-resistance due to electron trapping by the current collapse at the time when a high voltage is applied between the source electrode and the drain electrode. For that reason, the layer thickness of TaN layer 411a and the layer thickness of TiN layer 411b need to be considered such that the metal atoms of first wiring layer 411c do not diffuse from first wiring layer 411c to AlGaN layer 104a or first insulating layer 211 even if a temperature of approximately 250° C. to 500° C. is applied due to the thermal history during the manufacturing process. However, in PTL 1 and PTL 2, the layer thickness definition for TaN layer 411a and the layer thickness definition for TiN layer 411b are not provided, and thus the properties for controlling the diffusion of metal atoms of first wiring layer 411c into AlGaN layer 104a or first insulating layer 211 are unclear.

The present disclosure has been conceived in view of such a problem as described above, and has an object to provide a semiconductor device which includes a gate electrode with high reliability and low on-resistance.

Solution to Problem

In order to achieve the above-described object, a semiconductor device according to an aspect of the present disclosure includes: a substrate; a first nitride semiconductor layer disposed above the substrate; a second nitride semiconductor layer disposed above the first nitride semiconductor layer, the second nitride semiconductor layer having a larger band gap than a band gap of the first nitride semiconductor layer; a first insulating layer disposed above the second nitride semiconductor layer; a source electrode and a drain electrode spaced apart from each other, the source electrode and the drain electrode each penetrating through the first insulating layer and being electrically connected to the first nitride semiconductor layer; an opening portion provided in the first insulating layer between the source electrode and the drain electrode to expose the second nitride semiconductor layer; and a gate electrode spaced apart from the source electrode and the drain electrode, the gate electrode being in contact with the second nitride semiconductor layer in the opening portion. In the semiconductor device, the gate electrode includes: a first barrier layer including TaN and having a layer thickness of Z1, the first barrier layer being a layer that forms a Schottky junction with the second nitride semiconductor layer; a second barrier layer disposed above and in contact with the first barrier layer, the second barrier layer including TiN or WN and having a layer thickness of Z2; and a wiring layer disposed above and in contact with the second barrier layer, and 200 nm≥Z1+Z2≥50 nm, Z1<Z2, and 50 nm>Z1>3 nm are satisfied.

Advantageous Effects of Invention

With the semiconductor device according to the present disclosure, it is possible to obtain a semiconductor device which includes a gate electrode with high reliability and low on-resistance.

DESCRIPTION OF EMBODIMENTS

The inventors have conducted a series of diligent investigation and experiments in order to provide a semiconductor device which includes a gate electrode with high reliability and low on-resistance. As a result, the inventors have arrived at the following semiconductor device, etc.

Hereinafter, a semiconductor device, etc. according to an aspect of the present disclosure will be described with reference to the drawings. It should be noted that each of the embodiments described below shows a specific example of the present disclosure. The numerical values, shapes, structural elements, the arrangement and connection of the structural elements, steps (processes), and the processing order of the steps, for instance, described in the following embodiments are mere examples, and thus are not intended to limit the scope of the present disclosure. Among the structural elements in the embodiments described below, those not recited in the independent claims will be described as optional structural elements.

In addition, each diagram is a schematic diagram and not necessarily strictly illustrated. Throughout the drawings, the same numeral is given to substantially the same structural element, and redundant description will be omitted or simplified.

Moreover, in this Description, the terms "above" and "below" used to describe a configuration of the semiconductor device do not refer to the vertically upward direction and vertically downward direction in terms of absolute spatial recognition, but are used as terms defined by relative positional relationships based on the stacking order in a stacked structure. In addition, the terms "above" and "below" are used not only when a structural element is present between two other structural elements spaced apart from each other, but also when two structural elements are disposed in close contact with each other.

In addition, in this Description and Drawings, the x-axis, the y-axis, and the z-axis refer to the three axes of a three-dimensional orthogonal coordinate system. In each of the embodiments, the two axes parallel to the upper surface included by the substrate that the semiconductor device includes are the x-axis and the y-axis, and the direction orthogonal to this upper surface is the z-axis direction. In the embodiments described below, the z-axis positive direction may be described as above and the z-axis negative direction may be described as below.

In addition, in this Description, "plan view" refers to the view of the substrate included by the semiconductor device from the z-axis positive direction.

Embodiment 1

Figure 1:
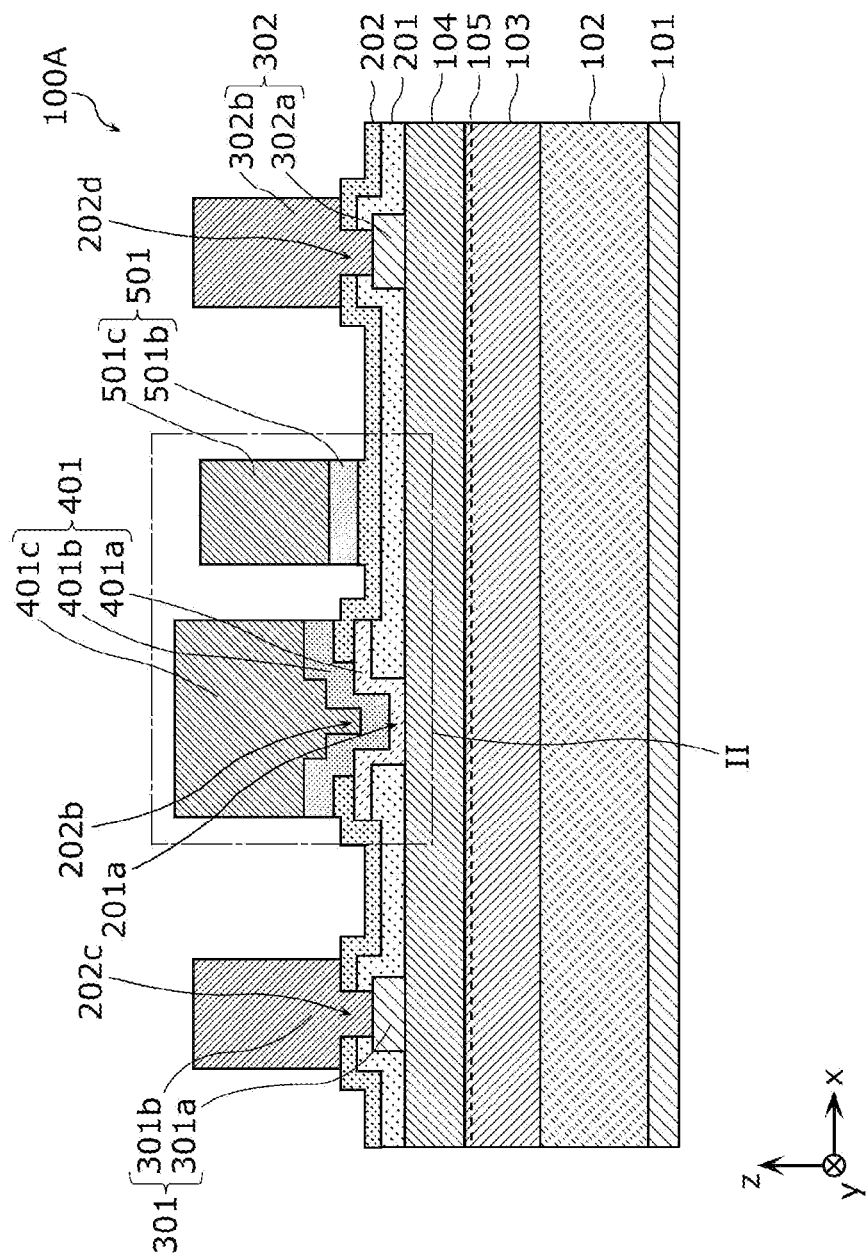
FIG. 1 is a cross-sectional view illustrating a configuration of a semiconductor device according to Embodiment 1.
Figure 2:
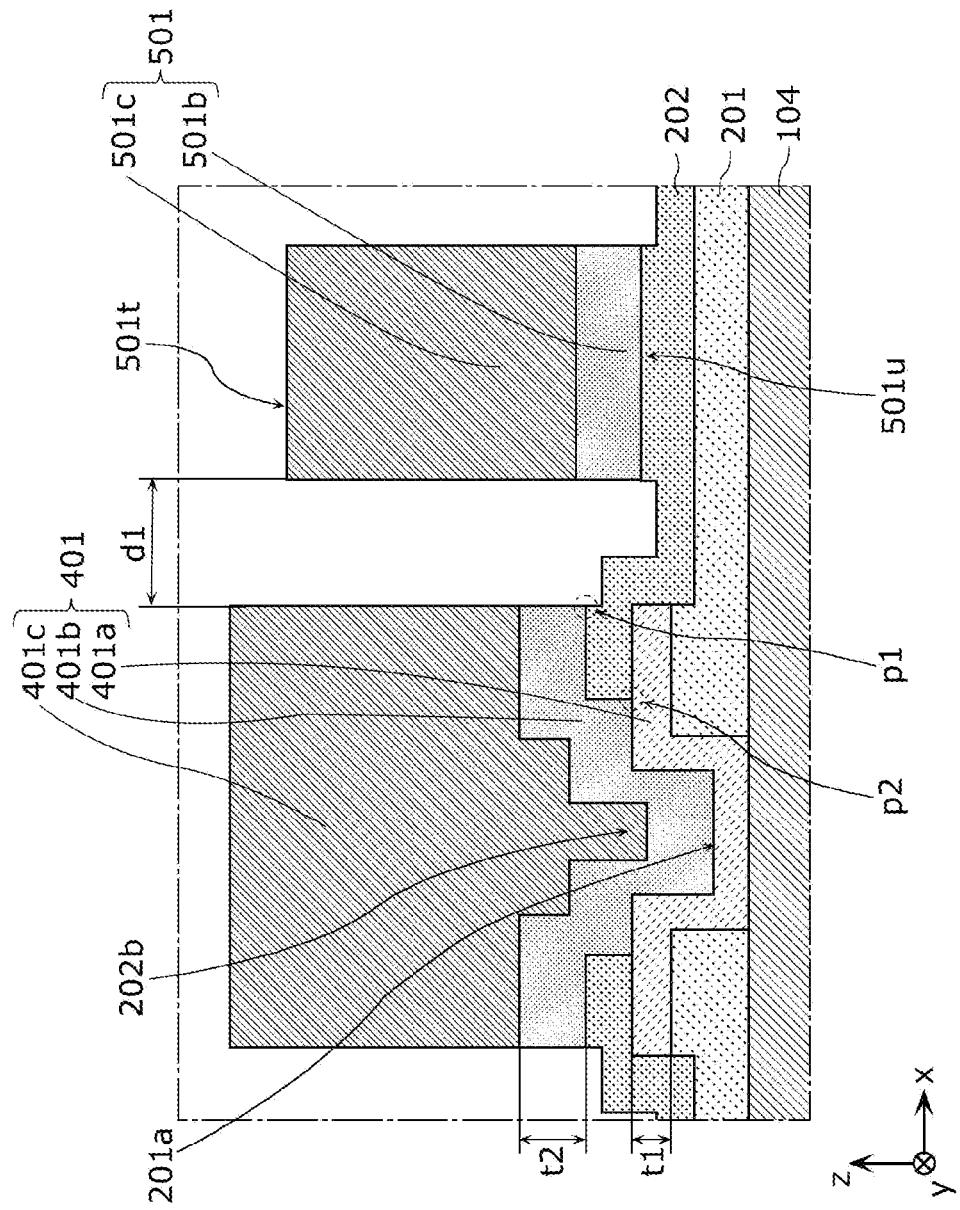
FIG. 2 is a cross sectional view illustrating region II of FIG. 1 enlarged.

First, a semiconductor device according to Embodiment 1 will be described with reference to FIG. 1 and FIG. 2. FIG. 1 is a cross-sectional view illustrating a configuration of semiconductor device 100A according to Embodiment 1. FIG. 2 is a cross sectional view illustrating region II of FIG. 1 enlarged. In the present embodiment, the case in which semiconductor device 100A is a high electron mobility transistor (HEMT) provided with a Schottky-junction gate structure will be described.

As illustrated in FIG. 1, semiconductor device 100A includes: substrate 101; buffer layer 102; first nitride semiconductor layer 103; second nitride semiconductor layer 104; two-dimensional electron gas layer 105; first insulating layer 201; an opening portion (in this case, first opening portion 201a); second insulating layer 202; second opening portion 202b; third opening portion 202c; fourth opening portion 202d; source electrode 301 including ohmic electrode 301a and second wiring layer 301b; drain electrode 302 including ohmic electrode 302a and second wiring layer 302b; gate electrode 401 including first barrier layer 401a, second barrier layer 401b, and a wiring layer (in this case, first wiring layer 401c), and field plate electrode 501 including third barrier layer 501b and third wiring layer 501c.

According to the present embodiment, substrate 101 is, for example, a substrate including Si. Substrate 101 is not limited to a substrate including Si, but may also be a substrate including sapphire, SiC, GaN, AlN, or the like.

Buffer layer 102 is disposed above substrate 101. According to the present embodiment, buffer layer 102 is, for example, a group III nitride semiconductor layer having a layer thickness of 2 μm, more specifically, a group III nitride semiconductor layer having a stacked structure including a plurality of layers of AlN and AlGaN. In addition, the layer thickness is the thickness of a layer in the z-axis direction. Buffer layer 102 may alternatively include a single layer or a plurality of layers of group III nitride semiconductors such as GaN, AlGaN, AlN, InGaN, or AlInGaN, etc.

First nitride semiconductor layer 103 is disposed above substrate 101, more specifically, above buffer layer 102. According to the present embodiment, first nitride semiconductor layer 103 includes GaN with a layer thickness of 200 nm, for example. It should be noted that first nitride semiconductor layer 103 is not limited to the configuration including a group III nitride semiconductor of GaN, but may have a configuration including a group III nitride semiconductor such as InGaN, AlGaN, or AlInGaN, and first nitride semiconductor layer 103 may contain an n-type impurity.

Second nitride semiconductor layer 104 has a band gap larger than a band gap of first nitride semiconductor layer 103, and is disposed above first nitride semiconductor layer 103. According to the present embodiment, second nitride semiconductor layer 104 includes, for example, AlGaN having a layer thickness of 20 nm and an Al composition ratio of 25%. It should be noted that "an Al composition ratio of 25%" indicates $Al_{0.25}Ga_{0.75}N$. On a first nitride semiconductor layer 103 side at the hetero interface between second nitride semiconductor layer 104 and first nitride semiconductor layer 103, a two-dimensional electron gas with a high concentration is generated, and a channel of two-dimensional electron gas layer 105 is formed.

It should be noted that second nitride semiconductor layer 104 is not limited to the configuration including a group III nitride semiconductor of AlGaN, but may have a configuration including a group III nitride semiconductor such as AlInGaN or the like, and second nitride semiconductor layer 104 may contain an n-type impurity.

It should be noted that a cap layer, for example, including GaN and having a layer thickness of approximately 1 nm or more and 2 nm or less may be disposed as a cap layer above second nitride semiconductor layer 104. In other words, such a cap layer may be disposed between second nitride semiconductor layer 104 and first insulating layer 201. In addition, a spacer layer, for example, including AlN and having a layer thickness of approximately 1 nm may be disposed as a spacer layer between first nitride semiconductor layer 103 and second nitride semiconductor layer 104.

Ohmic electrodes 301a and 302a are disposed above second nitride semiconductor layer 104 to face each other. According to the present embodiment, ohmic electrodes 301a and 302a are each a multilayer electrode film having a stacked structure in which, for example, a Ti film and an Al film are stacked in sequence, but not limited to this configuration. In addition, ohmic electrodes 301a and 302a are each electrically in ohmic contact with two-dimensional electron gas layer 105.

It should be noted that, under each of ohmic electrodes 301a and 302a, at least one of a recess resulting from removing a portion of second nitride semiconductor layer 104 and first nitride semiconductor layer 103 or a contact layer including an n-type impurity including a donor such as Si may be provided. In addition, the contact layer including an n-type impurity may be formed by plasma treatment, ion implantation and regrowth, etc.

First insulating layer 201 is disposed above second nitride semiconductor layer 104. According to the present embodiment, first insulating layer 201 is disposed to cover a top of second nitride semiconductor layer 104, a portion of ohmic electrode 301a, and a portion of ohmic electrode 302a. According to the present embodiment, first insulating layer 201 includes SiN with a layer thickness of 100 nm, for example.

First opening portion 201a is an example of an opening portion provided in first insulating layer 201 such that second nitride semiconductor layer 104 is exposed, between source electrode 301 and drain electrode 302. According to the present embodiment, first opening portion 201a is formed by removing a portion of first insulating layer 201 between ohmic electrode 301a and ohmic electrode 302a such that second nitride semiconductor layer 104 is exposed.

First barrier layer 401a is disposed above second nitride semiconductor layer 104 exposed by first opening portion 201a and a portion of first insulating layer 201 to cover first opening portion 201a and the portion of first insulating layer 201. Here, layer thickness t1 of first barrier layer 401a is assumed to be Z1 as illustrated in FIG. 2. According to the present embodiment, first barrier layer 401a, for example, includes TaN having layer thickness t1 (Z1) of 30 nm and an NaCl structure oriented only in a (111) plane with an N/Ta ratio=1.00. In addition, first barrier layer 401a and second nitride semiconductor layer 104 form a Schottky junction with each other. 50 nm>Z1>3 nm is satisfied where Z1 denotes layer thickness t1.

It should be noted that, when TaN (first barrier layer 401a) is formed by sputtering, for example, Z1>10 nm is satisfied for causing TaN to have an NaCl structure oriented only in the (111) plane. When TaN (first barrier layer 401a) is formed by an atomic layer deposition method, the layer thickness is not limited to the above-described layer thickness, but there is a problem that the productivity is low.

It should be noted that first barrier layer 401a may be TaN having an NaCl structure oriented only in the (111) plane with an N/Ta ratio=0.70 to 1.00. With this configuration, it is possible to increase the Schottky barrier height as described in PTL 1.

The distance between neighboring metal atoms (i.e., the lattice constant) of TaN having the NaCl structure with an N/Ta ratio=0.70 to 1.00 is at least 0.310 nm and at most 0.315 nm. The lattice constant of AlGaN is at least 0.311 nm and at most 0.319 nm. Accordingly, it is possible to reduce the difference in the distance between atoms, between first barrier layer 401a including TaN and second nitride semiconductor layer 104 including AlGaN. For that reason, the formation of a dislocation is less likely to occur in first barrier layer 401a, and thus it is possible to reduce the diffusion of metal atoms of first wiring layer 401c through the dislocation in first barrier layer 401a.

Second insulating layer 202 is disposed to cover a top of first insulating layer 201 and first barrier layer 401a. More specifically, second insulating layer 202 is disposed to cover a top of first insulating layer 201 and a top of a portion of first barrier layer 401a. According to the present embodiment, for example, second insulating layer 202 includes a material having an oxygen content of 1% or less, for example, SiN with a layer thickness of 150 nm. It should be noted that, second insulating layer 202 is not limited to SiN, but may be SiC or SiCN.

Second opening portion 202b is formed by removing a portion of second insulating layer 202, and is provided to cover the range of first opening portion 201a in a plan view as well as to expose first barrier layer 401a. In this case, in a plan view, first opening portion 201a is located to be encompassed by second opening portion 202b which is larger in size.

It should be noted that second opening portion 202b is provided to cover the range of first opening portion 201a in a plan view, but the present disclosure is not limited to this configuration, and the edge portion of second opening portion 202b on a drain electrode 302 side may be located inside first opening portion 201a. In other words, in this case, the size of second opening portion 202b is smaller in a plan view compared to second opening portion 202b in semiconductor device 100A illustrated in FIG. 1. As described above, by reducing the size of second opening portion 202b which can be a path for the metal atoms of first wiring layer 401c to diffuse, it is possible to further reduce the diffusion of metal atoms of first wiring layer 401c into first insulating layer 201 and second nitride semiconductor layer 104 on the drain electrode 302 side.

Second barrier layer 401b and first wiring layer 401c are stacked in stated order. Second barrier layer 401b is disposed above first barrier layer 401a exposed by second opening portion 202b and a portion of second insulating layer 202, in contact with first barrier layer 401a, to cover second opening portion 202b. Furthermore, first wiring layer 401c is provided above and in contact with second barrier layer 401b. It should be noted that first wiring layer 401c is an example of the wiring layer disposed above and in contact with second barrier layer 401b. In this manner, gate electrode 401 which includes first barrier layer 401a, second barrier layer 401b, and first wiring layer 401c is formed.

According to the present embodiment, second barrier layer 401b is, for example, a layer including TiN or WN having layer thickness t2 (see FIG. 2) of 50 nm. It should be noted that, in the following description, layer thickness t2 of second barrier layer 401b is assumed to be Z2. First wiring layer 401c includes, for example, Al having a layer thickness of 450 nm.

It should be noted that second barrier layer 401b is not limited to a single layer of TiN or WN, but may have a stacked structure including a plurality of layers of TiN and WN. First wiring layer 401c is not limited to Al, but may be W, Au, or Cu, or a compound containing these elements, or a multilayer electrode film having a stacked structure including a plurality of layers including these elements.

It should be noted that, when second barrier layer 401b includes TiN, TiN may have an NaCl structure with an N/Ti ratio=1.00 to 1.20. Alternatively, when second barrier layer 401b includes WN, WN may have an NaCl structure with an N/W ratio=0.10. In this manner, second barrier layer 401b is provided above first barrier layer 401a including TaN having an NaCl structure oriented only in a (111) plane with an N/Ta ratio=1.00. As a result, second barrier layer 401b can have a crystal structure oriented only in the (111) plane. In addition, the distance (lattice constant) between neighboring metal atoms of second barrier layer 401b including TiN or WN oriented only in the (111) plane is approximately 0.302 nm for TiN or approximately 0.298 nm for WN. The distance (lattice constant) between neighboring metal atoms of first barrier layer 401a including TaN with an N/Ta ratio=1.00 is 0.315 nm. As described above, since the difference in distance between the neighboring metal atoms is small between second barrier layer 401b and first barrier layer 401a, the formation of a dislocation is less likely to occur in second barrier layer 401b. For that reason, metal diffusion of the metal atoms in first wiring layer 401c through the dislocation in second barrier layer 401b is reduced.

In addition, as a result of second barrier layer 401b having the crystal structure that is an NaCl structure oriented only in the (111) plane, it is facilitated to make the crystal structure of first wiring layer 401c to be provided above second barrier layer 401b have the crystal structure oriented only in the (111) plane. When first wiring layer 401c includes Al having a layer thickness of 450 nm, the crystal structure of first wiring layer 401c is a face-centered cubic (FCC) structure oriented only in a (111) plane, and the distance between neighboring metal atoms is 0.286 nm. In this manner, it is possible to reduce the resistance and enhance the reliability of first wiring layer 401c.

In addition, the distance between neighboring metal atoms gradually decreases from the lower layer to the upper layer, as in first barrier layer 401a including TaN, second barrier layer 401b including TiN or WN, and first wiring layer 401c including Al. As a result, the formation of a dislocation is less likely to occur in first wiring layer 401c. For that reason, it is possible to further reduce the resistance and enhance the reliability of first wiring layer 401c.

As described above, gate electrode 401 according to the present embodiment is an electrode including first barrier layer 401a, second barrier layer 401b, and first wiring layer 401c. In addition, as illustrated in FIG. 1, gate electrode 401 is an electrode that is spaced apart from source electrode 301 and drain electrode 302, and is in contact with second nitride semiconductor layer 104 in first opening portion 201a. In other words, gate electrode 401 is an electrode that penetrates through first insulating layer 201 and second insulating layer 202, and is in contact with second nitride semiconductor layer 104.

Here, the positional relationship between first barrier layer 401a, second barrier layer 401b, and second insulating layer 202 will be explained.

First barrier layer 401a and second barrier layer 401b diverge on the path from first opening portion 201a toward drain electrode 302. More specifically, first barrier layer 401a and second barrier layer 401b diverge at divergent point p2 indicated as a dashed circle in FIG. 2. The direction from first opening portion 201a toward drain electrode 302 is the x-axis positive direction. In other words, first barrier layer 401a and second barrier layer 401b are in contact with each other on the x-axis negative side with respect to divergent point p2, and diverge and separate on the x-axis positive side with respect to divergent point p2. In addition, it can be said that second insulating layer 202 extends from the point above first barrier layer 401a to the point above first insulating layer 201, between divergent point p2 and drain electrode 302. In other words, on the x-axis positive side with respect to divergent point p2, a portion of second insulating layer 202 is sandwiched between first barrier layer 401a and second barrier layer 401b.

Field plate electrode 501 is an electrode provided above second insulating layer 202, between first opening portion 201a which is an example of an opening portion and drain electrode 302. Third barrier layer 501b and third wiring layer 501c which are included in field plate electrode 501 are stacked in stated order. Third barrier layer 501b is located in a portion of the top of second insulating layer 202 between second opening portion 202b and drain electrode 302. In this manner, field plate electrode 501 which includes third barrier layer 501b and third wiring layer 501c is formed. In addition, field plate electrode 501 is connected to the electric potential of source electrode 301. In this case, field plate electrode 501 indicates the same electric potential as the electric potential of source electrode 301.

Third barrier layer 501b has, for example, a configuration similar to, but not limited to, the configuration of second barrier layer 401b. In addition, third wiring layer 501c has, for example, a configuration similar to, but not limited to, the configuration of first wiring layer 401c.

It should be noted that, although not illustrated in the diagram, in the direction perpendicular to the upper surface (principal surface on the z-axis positive side) included in substrate 101 (z-axis direction), the uppermost surface position of field plate electrode 501 may be located below lower end position p1 of the side surface of second barrier layer 401b that is located closest to drain electrode 302. The uppermost surface position of field plate electrode 501 is a position of uppermost surface 501t of field plate electrode 501 illustrated in FIG. 2. In addition, here, the side surface of second barrier layer 401b is the surface of second barrier layer 401b parallel to the yz-plane, and the side surface that is located closest to drain electrode 302 is the side surface from which the distance to drain electrode 302 is shortest. In FIG. 2, lower end position p1 of the side surface of second barrier layer 401b is indicated by a dashed circle. In this case, although not illustrated in the diagram, the position of uppermost surface 501t may be located below lower end position p1 of the side surface of second barrier layer 401b (z-axis negative side). In this manner, the area in which field plate electrode 501 and gate electrode 401 face each other can be reduced. As a result, it is possible to reduce the electrostatic capacitance between field plate electrode 501 and gate electrode 401. It should be noted that, according to the present embodiment, as illustrated in FIG. 2, the uppermost surface position of field plate electrode 501 is located higher than lower end position p1 (z-axis positive side).

It should be noted that, according to the present embodiment, in the direction perpendicular to the upper surface included in substrate 101, the lowermost surface position of field plate electrode 501 is located below lower end position p1 of the side surface of second barrier layer 401b that is located closest to drain electrode 302. The lowermost surface position of field plate electrode 501 is a position of lowermost surface 501u of field plate electrode 501 illustrated in FIG. 2. In other words, in this case, as illustrated in FIG. 2, the position of lowermost surface 501u may be located below lower end position p1 of the side surface of second barrier layer 401b (z-axis negative side). In this manner, it is possible to further achieve electric field relaxation at the lower end of first barrier layer 401a which is located closest to drain electrode 302.

According to the present embodiment, field plate electrodes 501 partially includes a material identical to a material of second barrier layer 401b. More specifically, the material of second barrier layer 401b is the same as the material of third barrier layer 501b, and the material of first wiring layer 401c is the same as the material of third wiring layer 501c. In this manner, it is possible to form gate electrode 401 and field plate electrode 501 at the same time.

Field plate electrode 501 includes a plurality of layers including a lower layer and an upper layer. More specifically, field plate electrode 501 includes third barrier layer 501b that is the lower layer and third wiring layer 501c that is the upper layer. As described above, third barrier layer 501b and third wiring layer 501c include the same materials as second barrier layer 401b and first wiring layer 401c, respectively. Third barrier layer 501b and third wiring layer 501c are included in field plate electrode 501, and second barrier layer 401b and first wiring layer 401c are included in gate electrode 401. According to the present embodiment, furthermore, the resistivity of the upper layer is smaller than the resistivity of the lower layer. In other words, the resistivity of third wiring layer 501c including Al in the upper layer is smaller than the resistivity of third barrier layer 501b including TiN in the lower layer. Accordingly, it is possible to reduce the impedance of field plate electrode 501.

Third opening portion 202c and fourth opening portion 202d are formed by removing first insulating layer 201 and second insulating layer 202 such that a portion of ohmic electrode 301a and a portion of ohmic electrode 302a are exposed.

Second wiring layer 301b is disposed above ohmic electrode 301a exposed by third opening portion 202c and a portion of second insulating layer 202, to cover third opening portion 202c. In the same manner as above, second wiring layer 302b is disposed above ohmic electrode 302a exposed by fourth opening portion 202d and a portion of second insulating layer 202, to cover fourth opening portion 202d. According to the present embodiment, second wiring layer 301b and second wiring layer 302b each include, for example, TiN having a layer thickness of 200 nm, Al having a layer thickness of 3000 nm, and TiN having a layer thickness of 50 nm which are stacked in sequence. It should be noted that second wiring layer 301b and second wiring layer 302b are not limited to Al, but may be each Au or Cu in place of Al, or a compound containing these elements, or a multilayer electrode film having a stacked structure including a plurality of layers including these elements.

Source electrode 301 including ohmic electrode 301a and second wiring layer 301b and drain electrode 302 including ohmic electrode 302a and second wiring layer 302b are configured as described above. Source electrode 301 and drain electrode 302 are spaced apart from each other. Source electrode 301 and drain electrode 302 each penetrate through first insulating layer 201 and second insulating layer 202, and are electrically connected to first nitride semiconductor layer 103. In other words, according to the present embodiment, source electrode 301 and drain electrode 302 are in contact with second nitride semiconductor layer 104 in third opening portion 202c and fourth opening portion 202d, respectively, and electrically connected to first nitride semiconductor layer 103.

Here, Z1 indicating layer thickness t1 of first barrier layer 401a and Z2 indicating layer thickness t2 of second barrier layer 401b will be described. 200 nm≥Z1+Z2≥50 nm, Z1<Z2, and 50 nm>Z1>3 nm are satisfied.

As a result of semiconductor device 100A having such a configuration as described above, the following advantageous effects are expected in comparison to the conventional technique of PTL 2. First, since Z1+Z2≥50 nm, the diffusion of metal atoms of first wiring layer 401c into first insulating layer 201 and second nitride semiconductor layer 104 is inhibited by first barrier layer 401a and second barrier layer 401b, and thus it is possible to reduce the generation of a level in first insulating layer 201 and second nitride semiconductor layer 104. As a result, it is possible to reduce the current collapse while reducing the reverse leakage current of gate electrode 401. Moreover, since Z1+Z2≥70 nm, it is possible to further reduce the current collapse while reducing the reverse leakage current of gate electrode 401. Accordingly, it is possible to obtain semiconductor device 100A including gate electrode 401 with high reliability and low on-resistance.

Figure 3:
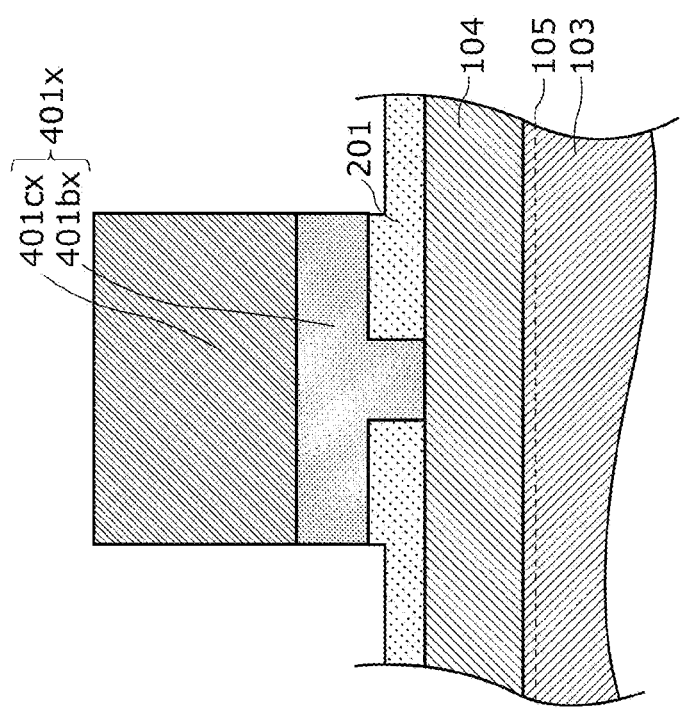
FIG. 3 is a cross-sectional view illustrating the portion in proximity to a gate electrode included in the semiconductor device according to a study example of Embodiment 1.
Figure 4:
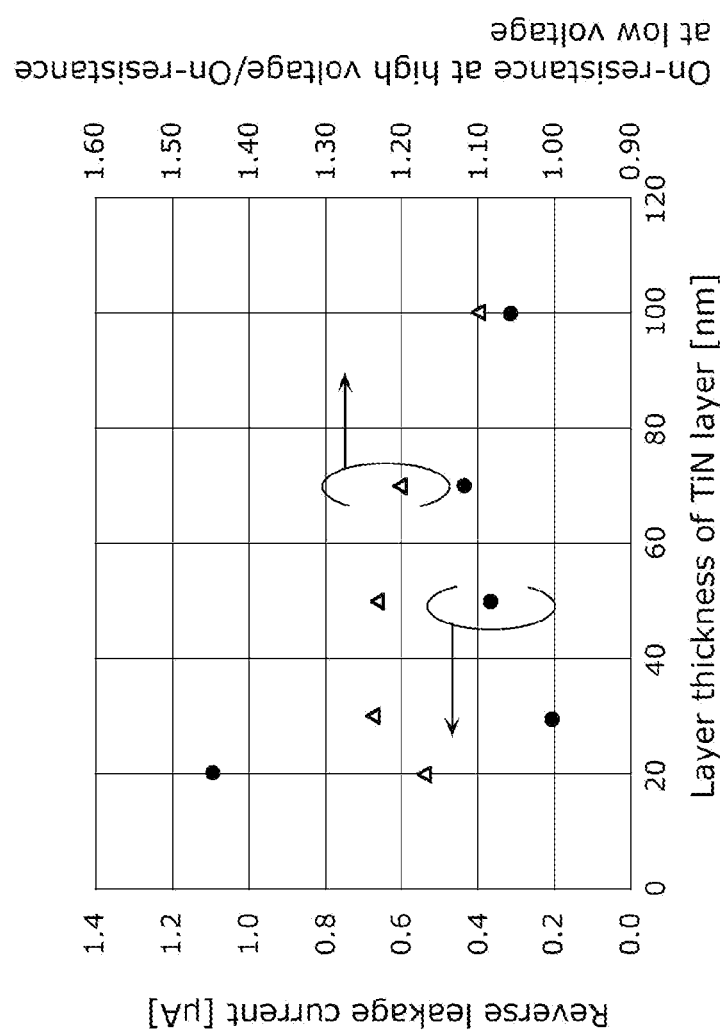
FIG. 4 is a diagram indicating layer thickness dependency results of a TiN layer on the reverse leakage current of the gate electrode and on-resistance at high voltage/on-resistance at low voltage, in the semiconductor device according to the study example of Embodiment 1.

The following describes the reason why it is possible, when Z1+Z2≥50 nm, to reduce the current collapse while reducing the reverse leakage current of gate electrode 401. FIG. 3 is a cross-sectional view illustrating the portion in proximity to gate electrode 401x included in the semiconductor device according to a study example of Embodiment 1. The semiconductor device according to this study example has the same configuration as the configuration of semiconductor device 100A according to the present embodiment, mainly other than that second insulating layer 202 is not provided and that gate electrode 401x includes a stacked structure of TiN layer 401bx and Al layer 401cx. FIG. 4 is a diagram indicating layer thickness dependency results of TiN layer 401bx for the reverse leakage current of gate electrode 401x and on-resistance at high voltage/on-resistance at low voltage, in the semiconductor device according to the study example of Embodiment 1. More specifically, the first axis (axis on the left side) of the graph in FIG. 4 indicates the layer thickness dependency results of TiN layer 401bx for the reverse leakage current of gate electrode 401x. Next, the second axis (axis on the right side) of the graph in FIG. 4 indicates the layer thickness dependency results of TiN layer 401bx for the ratio, which is an indicator of current collapses, between the on-resistance at high voltage (85V) and the on-resistance at low voltage (30V) when switching is carried out by applying a voltage between source electrode 301 and drain electrode 302.

Figure 5:
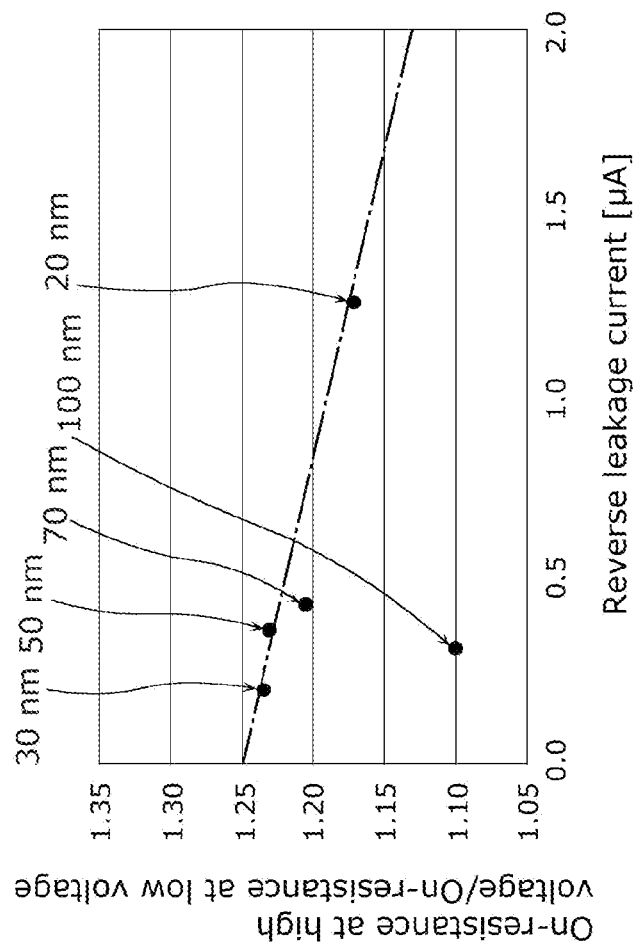
FIG. 5 is another diagram indicating layer thickness dependency results of the TiN layer on the reverse leakage current of the gate electrode and on-resistance at high voltage/on-resistance at low voltage, in the semiconductor device according to the study example of Embodiment 1.

FIG. 5 is another diagram indicating layer thickness dependency results of TiN layer 401bx for the reverse leakage current of gate electrode 401x and on-resistance at high voltage/on-resistance at low voltage in the semiconductor device according to the study example of Embodiment 1. More specifically, the horizontal axis of the graph in FIG. 5 indicates the reverse leakage current of gate electrode 401x, and the vertical axis of the graph in FIG. 5 indicates the ratio of the on-resistance at a high voltage (85 V) to the on-resistance at a low voltage (30 V) described above. In addition, the layer thicknesses of TiN layer 401bx are indicated outside the frame of the graph.

As illustrated in FIG. 4, the layer thickness dependency results of TiN layer 401bx for the reverse leakage current of gate electrode 401x show that the reverse leakage current of gate electrode 401x can be reduced when the layer thickness of TiN layer 401bx is 30 nm or more. The variation of the reverse leakage current of gate electrode 401x when the layer thickness of TiN layer 401bx is at least 30 nm and at most 100 nm is considered to be a manufacturing variation because the variation is sufficiently small compared to the variation range when the layer thickness of TiN layer 401bx changes from 20 nm to 30 nm. Next, the layer thickness dependency results of TiN layer 401bx for the ratio of the on-resistance at a high voltage to the on-resistance at a low voltage when switching is carried out show that the ratio of the on-resistance decreases and the current collapse is reduced when the layer thickness of TiN layer 401bx is at least 50 nm and at most 100 nm. Furthermore, when the layer thickness of TiN layer 401bx is at least 70 nm and at most 100 nm, the ratio of the on-resistance further decreases and the current collapse is reduced.

In general, electrons trapped in the level are released when there is a large amount of reverse leakage current of gate electrode 401x, and thus a reduction in the reverse leakage current of gate electrode 401x and an increase in current collapse are in a trade-off relationship. However, the results of this study show that when the layer thickness of TiN layer 401bx is at least 50 nm, the current collapse is reduced without a change in the reverse leakage current of gate electrode 401x, and the trade-off relationship is resolved. When the layer thickness of TiN layer 401bx is at least 70 nm, the reduction in current collapse is significant. FIG. 5 illustrates a dashed-dotted straight line declining toward right, and shows that the reduction in the reverse leakage current and an increase in current collapse are more in a trade-off relationship as closer to the dashed-dotted straight line. As indicated in FIG. 5, as the layer thickness of TiN layer 401bx increases to 50 nm, 70 nm, and 100 nm, the ratio of the on-resistance is increasingly away from the dashed-dotted straight line declining toward right, and the trade-off relationship is resolved.

In addition, when the layer thickness of TiN layer 401bx is 20 nm, it is considered that the diffusion of Al metal atoms have caused a decrease in the Schottky barrier, resulting in an increase in the reverse leakage current of gate electrode 401x. For that reason, the current collapse is considered to be more reduced compared to the case where the layer thickness of TiN layer 401bx is 50 nm.

Here, semiconductor device 100A according to the present embodiment and the semiconductor device according to the study example will be compared. Gate electrode 401 according to the present embodiment includes first barrier layer 401a (TaN), second barrier layer 401b (TiN), and first wiring layer 401c (Al). In contrast, gate electrode 401x according to the study example includes TiN layer 401bx and Al layer 401cx. In other words, when a portion of TiN layer 401bx according to the study example is replaced with first barrier layer 401a, gate electrode 401x according to the study example and gate electrode 401 according to the present embodiment have the same configuration.

Here, in regard to TaN, the work function is 5.4 ev, the lattice constant is at least 0.310 nm and at most 0.315 nm, and the melting point is 3090 degrees Celsius. In regard to TiN, the work function is 4.7 eV, the lattice constant is 0.302 nm, and the melting point is 2930 degrees Celsius.

For that reason, in gate electrode 401 having a configuration in which a portion of TiN layer 401bx according to the study example is replaced with first barrier layer 401a (TaN), the work function is increased and the lattice constant and melting point are approximately the same compared to gate electrode 401x according to the study example. Accordingly, if the layer thickness of TiN layer 401bx and Z1+Z2 (the sum of the layer thickness of first barrier layer 401a and the layer thickness of second barrier layer 401b) are equivalent, it is expected that the reverse leakage current will be more inhibited and the current collapse will be more reduced in gate electrode 401, compared to gate electrode 401x.

In other words, according to the present embodiment as well, by satisfying Z1+Z2≥50 nm, it is expected that the reverse leakage current is inhibited and the current collapse is reduced. More specifically, it is considered that, by satisfying Z1+Z2≥50 nm, the diffusion of metal atoms of first wiring layer 401c into first insulating layer 201 and second nitride semiconductor layer 104 is inhibited by first barrier layer 401a and second barrier layer 401b, and thus it is possible to reduce the level in first insulating layer 201 and second nitride semiconductor layer 104. As a result, it is possible to reduce the current collapse while reducing the reverse leakage current of the gate electrode 401. Moreover, by satisfying Z1+Z2≥70 nm, it is possible to further reduce the current collapse while reducing the reverse leakage current of the gate. As a result, it is possible to obtain semiconductor device 100A including gate electrode 401 with high reliability and low on-resistance.

In addition, in regard to WN, the work function is 4.6 eV, the lattice constant is 0.298 nm, which are values equivalent to those of TiN. In regard to WN, the melting point is less than 2000 degrees Celsius, which is sufficiently high. Therefore, the same advantageous effects are expected when second barrier layer 401b of gate electrode 401 includes WN instead of TiN.

From the perspective of processing and crystallinity of first barrier layer 401a and second barrier layer 401b, it is preferable that Z1+Z2≤200 nm is satisfied, more preferable that Z1+Z2≤150 nm is satisfied, and yet more preferable that Z1+Z2≤100 nm is satisfied.

Moreover, since, in addition to second barrier layer 401b including TiN or WN, first barrier layer 401a includes TaN which is a material with a higher melting point, and has layer thickness t1 that satisfies Z1>3 nm, it is possible to more inhibit the metal diffusion into first insulating layer 201 and second nitride semiconductor layer 104 compared to the case where gate electrode 401 includes only second barrier layer 401b. When TaN is formed by sputtering, first barrier layer 401a grows into a discontinuous island shape in the initial process of deposition, and thus a uniform film shape is more easily obtained by satisfying Z1>3 nm. Accordingly, for example, Z1>3 nm is satisfied. Moreover, it is preferable that Z1>10 nm is satisfied, and more preferable that Z1>15 nm is satisfied. It should be noted that, when TaN is formed by an atomic layer deposition method, although not always, there is a problem that the productivity is low. In addition, Z1 which indicates layer thickness t1 of first barrier layer 401a satisfies 50 nm>Z1. It is more preferable that 40 nm>Z1 is satisfied, and yet more preferable that 30 nm>Z1 is satisfied. TaN included in first barrier layer 401a exhibits high barrier properties, but has low workability by dry etching. Therefore, by making layer thickness t1 of first barrier layer 401a thin, e.g., 50 nm>Z1, it is possible to enhance the workability of first barrier layer 401a.

In addition, it is necessary to process TaN by dry etching. During processing by dry etching, the selectivity ratio between TaN and first insulating layer 201 decreases due to the high vapor pressure of halogen compounds in TaN, and thus the residual film variation of first insulating layer 201 increases. The increase in residual film variation of first insulating layer 201 results in an increase in the electrostatic capacitance capacitance variation of field plate electrode 501 and drain electrode 302. In contrast, since the vapor pressure of halogen compounds in TiN or WN is lower than that in TaN, the selectivity ratio between TiN or WN and first insulating layer 201 increases. For that reason, by satisfying Z1<Z2 as in the present embodiment, the diffusion of metal atoms of first wiring layer 401c into first insulating layer 201 and second nitride semiconductor layer 104 is inhibited and processing is facilitated compared to the conventional technique of PTL 2. As a result, the residual film variation of first insulating layer 201 is reduced. Accordingly, it is possible to reduce the electrostatic capacitance variation of field plate electrode 501 and drain electrode 302.

First barrier layer 401a which includes TaN as in the present embodiment is covered by first insulating layer 201 and second insulating layer 202 which include SiN, and second barrier layer 401b. In addition, second insulating layer 202 includes a material having an oxygen content of 1% or less. With this configuration, the oxidation of first barrier layer 401a which includes TaN is inhibited. In addition, in FIG. 2, closest distance d1 between gate electrode 401 and field plate electrode 501 is indicated. Closest distance d1 means the shortest distance among the gaps between gate electrode 401 and field plate electrode 501. For example, according to the present embodiment, closest distance d1 is the length in the x-axis direction in the cross-sectional view illustrated in FIG. 2, and is the gap between gate electrode 401 and field plate electrode 501. Closest distance d1 is at least 100 nm. It is preferable that closest distance d1 is 200 nm or more, and more preferable that closest distance d1 is 300 nm or more. In this way, it is possible to sufficiently increase the electrostatic discharge (ESD) breakdown voltage of gate electrode 401 and field plate electrode 501. Furthermore, it is preferable that closest distance d1 is 1000 nm or less, and more preferable that closest distance d1 is 900 nm or less, and yet more preferable that closest distance d1 is 800 nm or less. This facilitates the downsizing of semiconductor device 100A.

The following describes a manufacturing method of semiconductor device 100A according to the present embodiment with reference to FIG. 6 to FIG. 13.

FIG. 6 to FIG. 13 are each a cross-sectional view illustrating a manufacturing process of semiconductor device 100A according to Embodiment 1.

Figure 6:
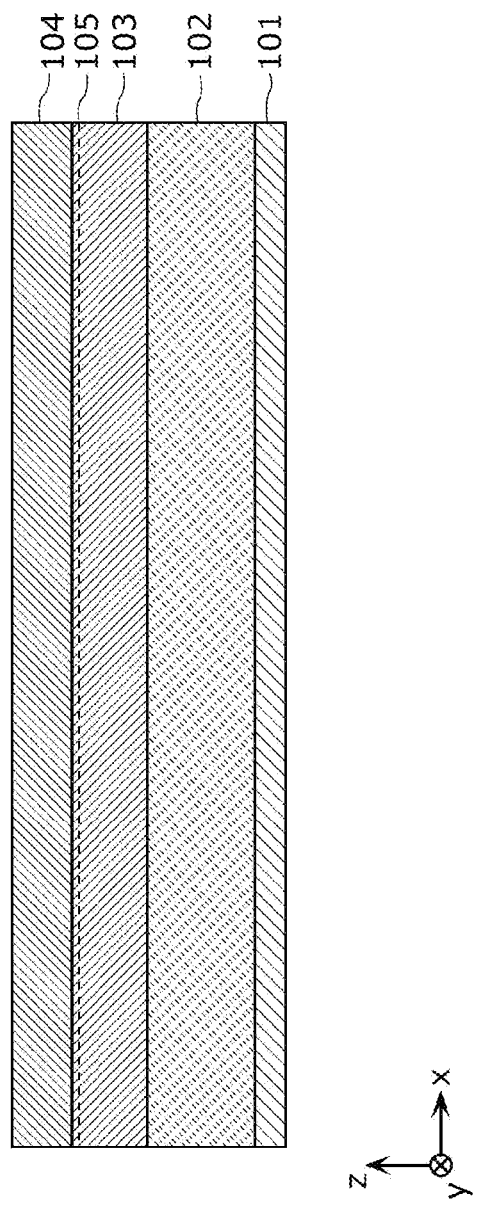
FIG. 6 is a cross-sectional view illustrating manufacturing process of the semiconductor device according to Embodiment 1.

First, as illustrated in FIG. 6, buffer layer 102 having a layer thickness of 2 μm and a stacked structure of AlN and AlGaN, first nitride semiconductor layer 103 having a layer thickness of 200 nm and including GaN, and second nitride semiconductor layer 104 having a layer thickness of 20 nm and an Al composition ratio of 25% are epitaxially grown in the +c-plane direction (<0001> direction) sequentially above substrate 101 including Si, using a metalorganic chemical vapor deposition (MOCVD). As a result, on the first nitride semiconductor layer 103 side at the hetero interface between second nitride semiconductor layer 104 and first nitride semiconductor layer 103, a two-dimensional electron gas with a high concentration is generated, and a channel of two-dimensional electron gas layer 105 is formed.

Figure 7:
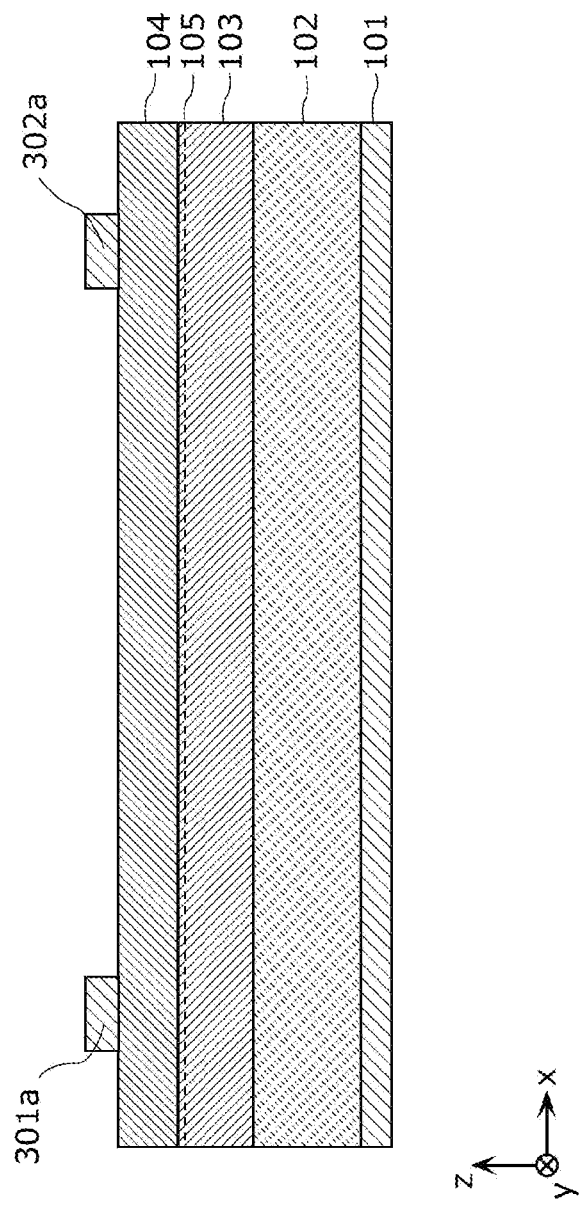
FIG. 7 is a cross-sectional view illustrating a manufacturing process of the semiconductor device according to Embodiment 1.

Next, pre-cleaning with hydrochloric acid is performed on second nitride semiconductor layer 104. Furthermore, in a region other than the region in which source electrode 301 and drain electrode 302 are to be formed, resist is applied and then the resist is patterned by the lithography method to form a mask. Next, after a Ti film and an Al film are deposited in sequence by vapor deposition, ohmic electrode 301a and ohmic electrode 302a are formed by the lift-off method, as illustrated in FIG. 7. Next, two-dimensional electron gas layer 105 is electrically connected in ohmic contact with ohmic electrode 301a and ohmic electrode 302a by heat treatment. It should be noted that, ohmic electrode 301a and ohmic electrode 302a may be formed by applying the lithography and dry etching methods in sequence after the Ti film and the Al film are deposited in sequence by the sputtering method.

Figure 8:
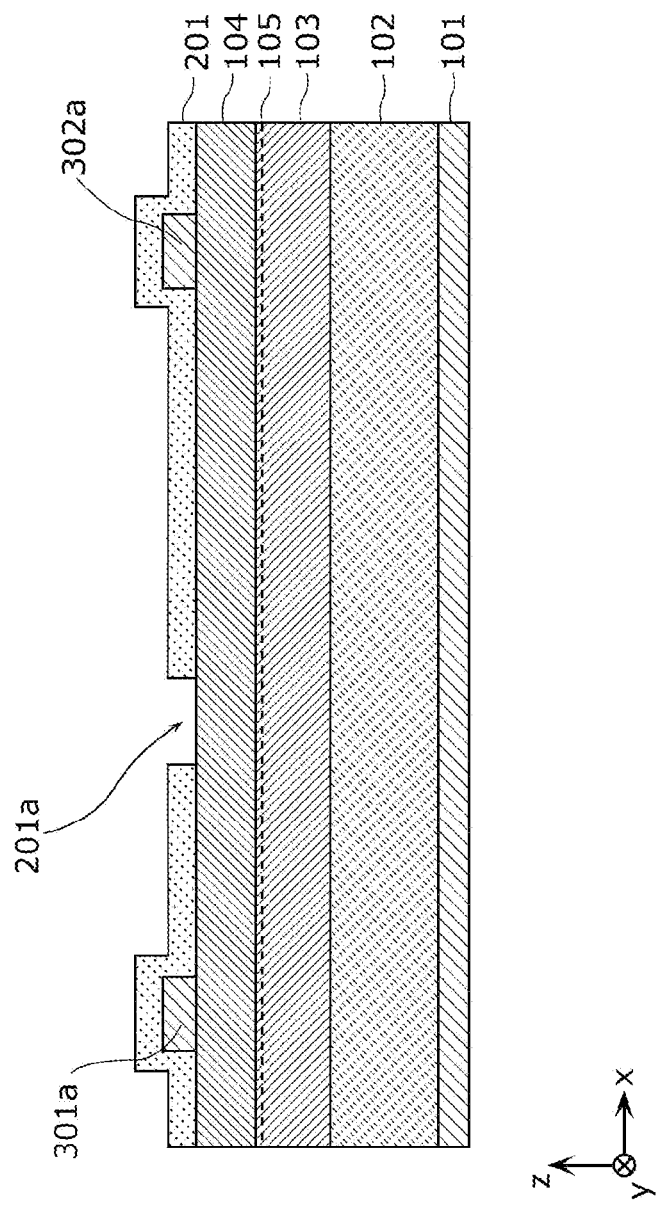
FIG. 8 is a cross-sectional view illustrating a manufacturing process of the semiconductor device according to Embodiment 1.

Next, as illustrated in FIG. 8, first insulating layer 201 including SiN and having a layer thickness of 100 nm is deposited by the plasma chemical vapor deposition (CVD) method. After that, resist is applied in a region other than the region in which gate electrode 401 is to be formed, and then the resist is patterned using the lithography method to form a mask. Next, the dry etching method is used to form first opening portion 201a such that second nitride semiconductor layer 104 is exposed. It should be noted that, according to the present embodiment, first insulating layer 201 may be SiCN, or SiN deposited by a low-pressure CVD method. In addition, a dry etching method is used according to the present embodiment, but a wet etching method may be used to provide first opening portion 201a in first insulating layer 201.

Figure 9:
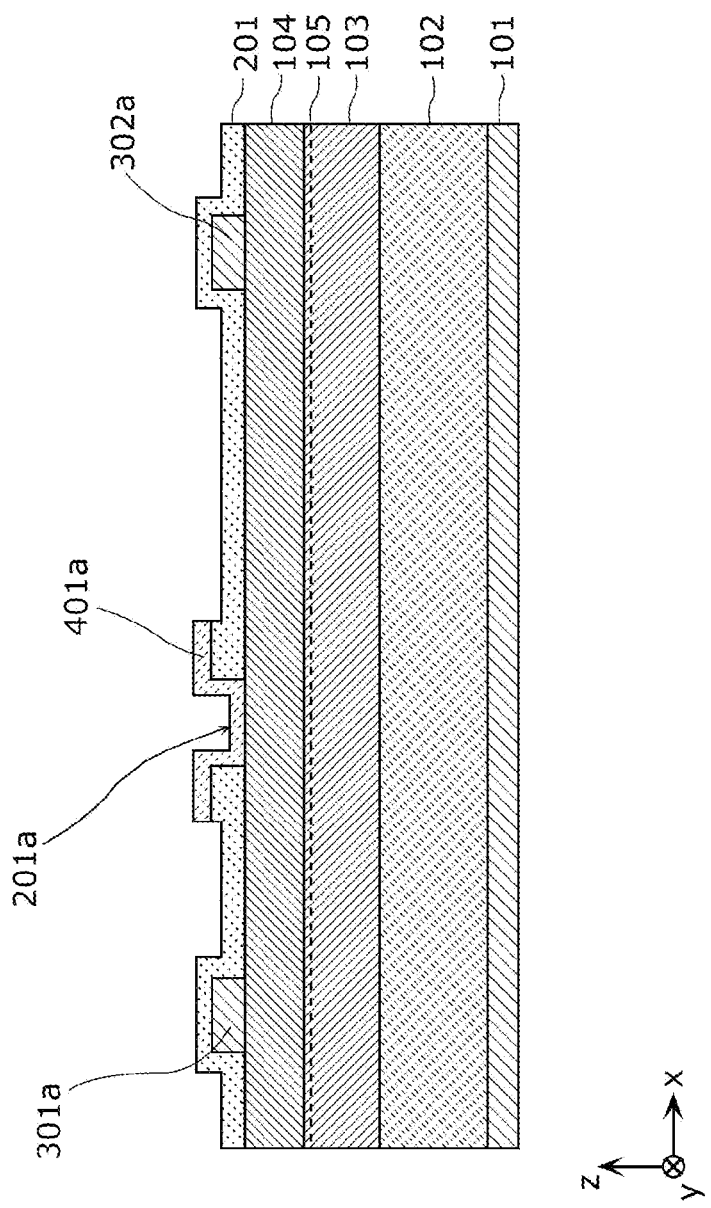
FIG. 9 is a cross-sectional view illustrating a manufacturing process of the semiconductor device according to Embodiment 1.

Next, as illustrated in FIG. 9, a sputtering device is used to perform sputtering on a Ta target with $N_2$ gas, thereby depositing first barrier layer 401a including TaN having a layer thickness of 30 nm. After that, resist is applied in a region in which gate electrode 401 is to be formed, and then the resist is patterned using the lithography method to form a mask. Next, first barrier layer 401a is patterned using a dry etching method. At this time, a portion of first insulating layer 201 is removed by over-etching. However, since the layer thickness of TaN (first barrier layer 401a) is as thin as 30 nm, the amount of removal of first insulating layer 201 can be kept to a minimum. As a result, the residual film variation of first insulating layer 201 is reduced.

Figure 10:
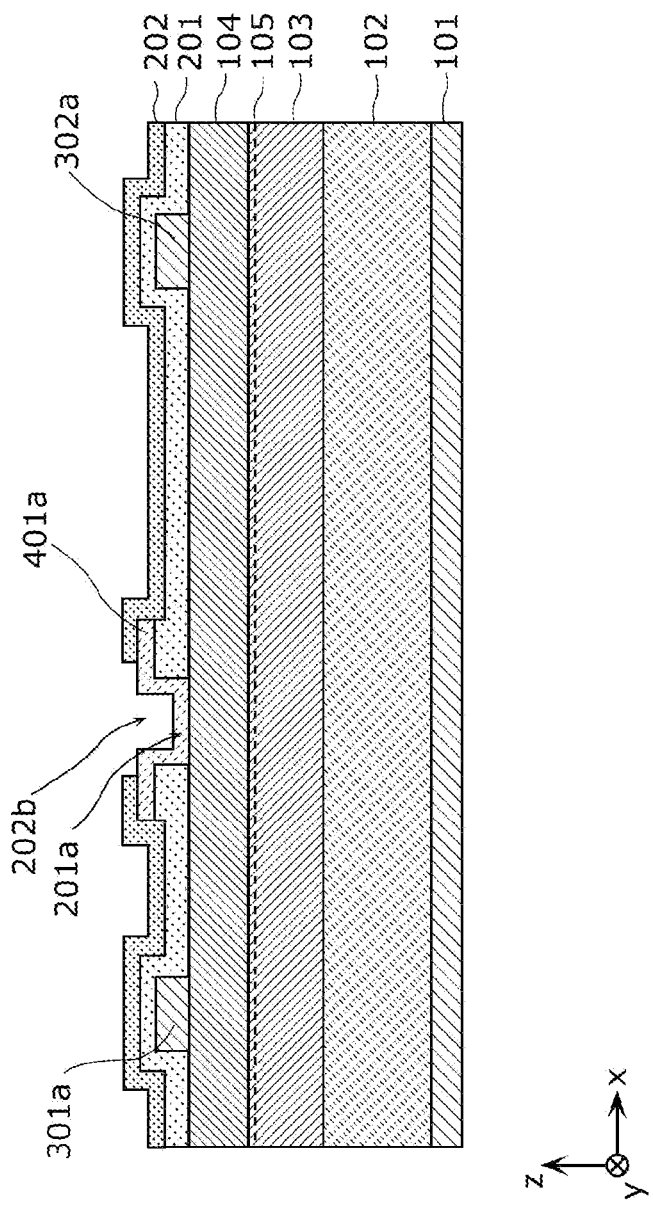
FIG. 10 is a cross-sectional view illustrating a manufacturing process of the semiconductor device according to Embodiment 1.

Next, as illustrated in FIG. 10, second insulating layer 202 including SiN and having a layer thickness of 150 nm is deposited by the plasma CVD method. After that, resist is applied in a region other than the region in which gate electrode 401 is to be formed, and then the resist is patterned using the lithography method to form a mask. Next, second opening portion 202b is formed using the dry etching method such that first barrier layer 401a is exposed.

Figure 11:
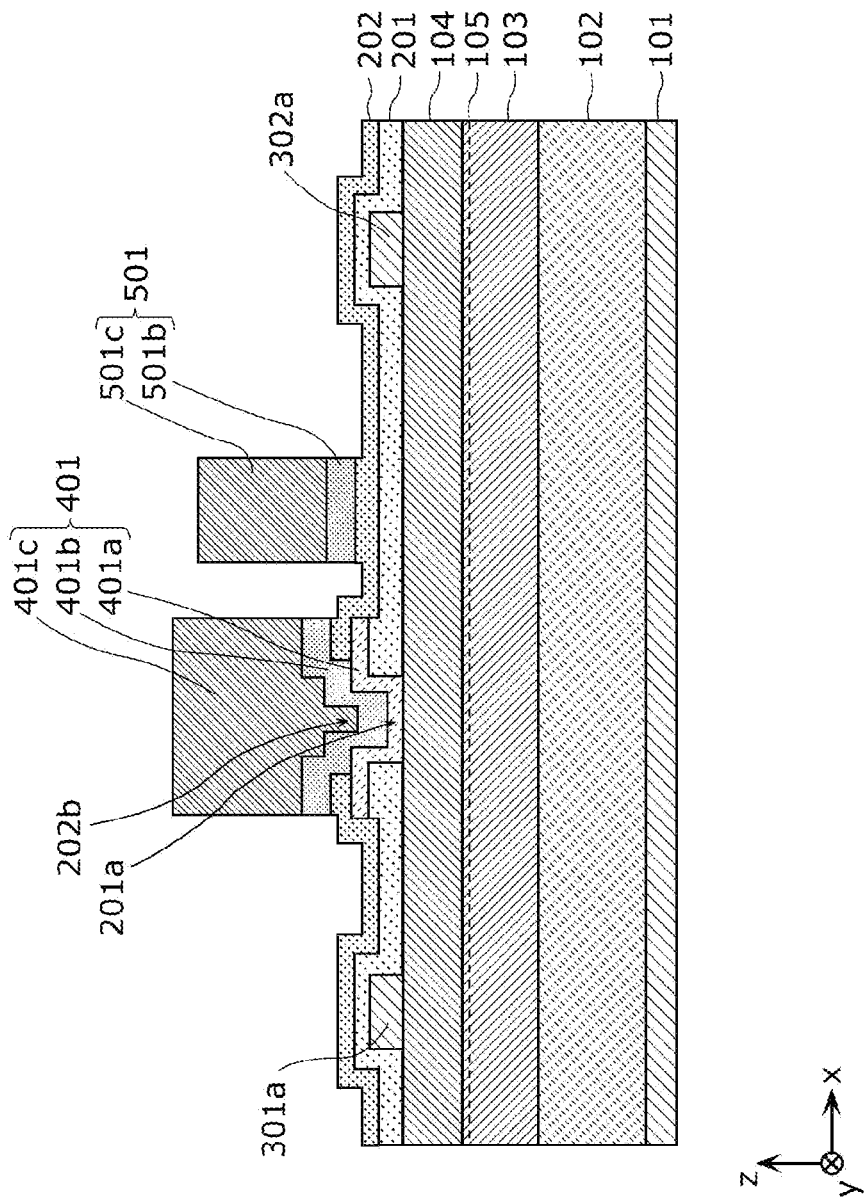
FIG. 11 is a cross-sectional view illustrating a manufacturing process of the semiconductor device according to Embodiment 1.

Next, TiN having a layer thickness of 50 nm and Al having a layer thickness of 450 nm are deposited in sequence by the sputtering method. As illustrated in FIG. 11, TiN having a layer thickness of 50 nm corresponds to second barrier layer 401b and third barrier layer 501b, and Al having a layer thickness of 450 nm corresponds to first wiring layer 401c and third wiring layer 501c. After that, resist is applied in a region in which gate electrode 401 and field plate electrode 501 are to be formed, and then the resist is patterned using the lithography method to form a mask. Next, second barrier layer 401b and third barrier layer 501b, and first wiring layer 401c and third wiring layer 501c, are patterned using a dry etching method. In the above-described manner, gate electrode 401 and field plate electrode 501 are formed.

Figure 12:
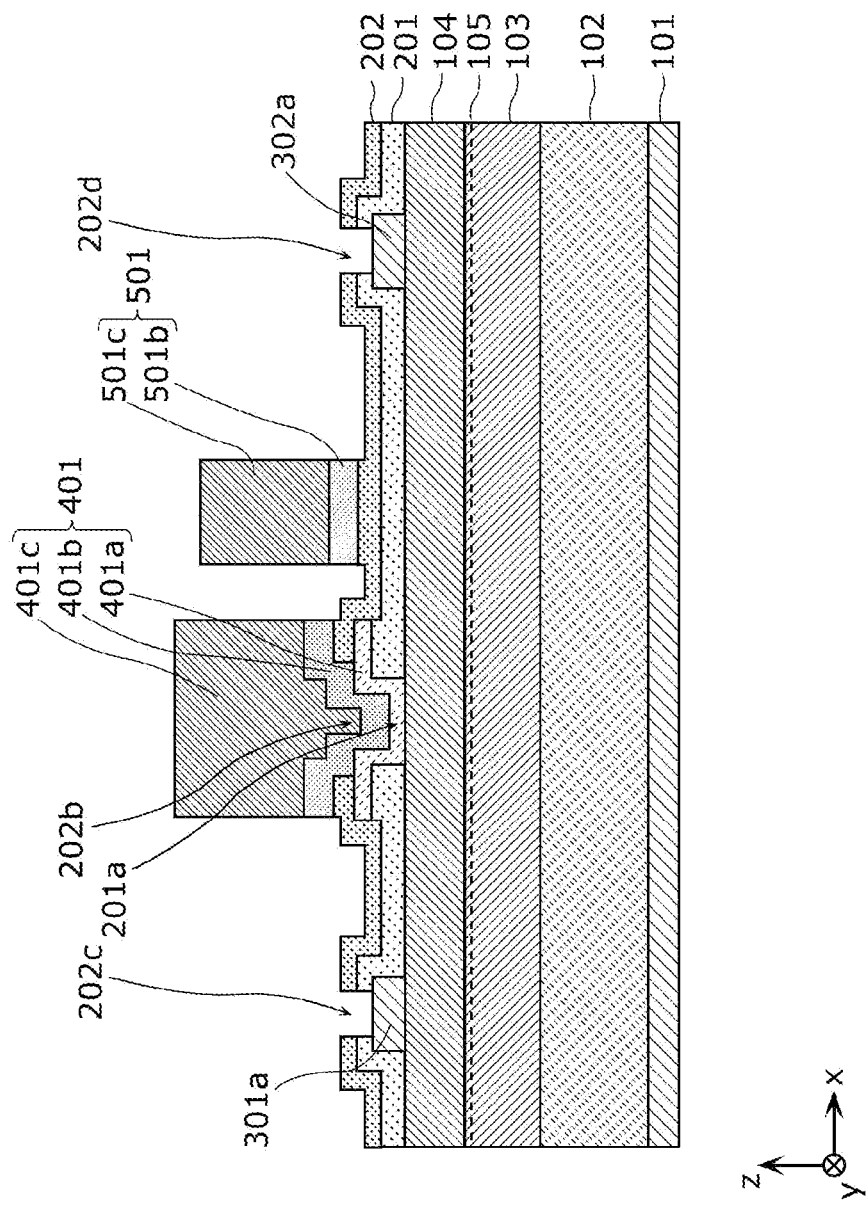
FIG. 12 is a cross-sectional view illustrating a manufacturing process of the semiconductor device according to Embodiment 1.

Next, as illustrated in FIG. 12, resist is applied in a region other than the region in which source electrode 301 and drain electrode 302 are to be formed, and then the resist is patterned using the lithography method to form a mask. Next, third opening portion 202c and fourth opening portion 202d are formed using the dry etching method such that ohmic electrode 301a and ohmic electrode 302a are exposed.

Figure 13:
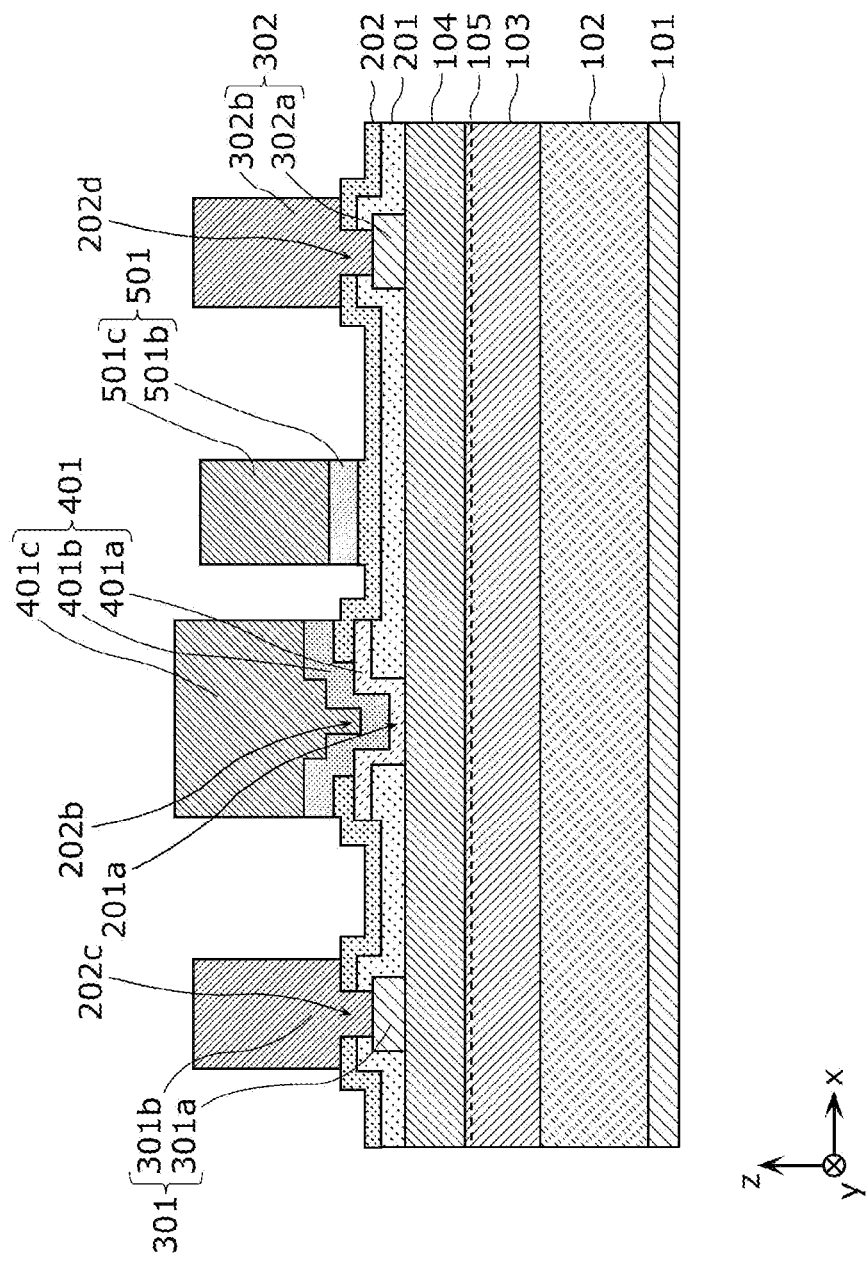
FIG. 13 is a cross-sectional view illustrating a manufacturing process of the semiconductor device according to Embodiment 1.

Next, as illustrated in FIG. 13, TiN having a layer thickness of 200 nm, Al having a layer thickness of 3000 nm, and TiN having a layer thickness of 50 nm are deposited in sequence by the sputtering method. Then, resist is applied in a region in which source electrode 301 and drain electrode 302 are to be formed, and then the resist is patterned using the lithography method to form a mask. Next, second wiring layer 301b and second wiring layer 302b are patterned using the dry etching method. In the above-described manner, source electrode 301 and drain electrode 302 are formed. It should be noted that second wiring layer 301b and second wiring layer 302b may be formed not only by the dry etching method but also by the plating or damascene method. In this case, Au or Cu may be used for the wiring.

By going through the series of the processes as described above, the manufacturing of semiconductor device 100A that has the configuration illustrated in FIG. 1 is completed.

In semiconductor device 100A formed as described above, by satisfying 200 nm≥Z1+Z2≥50 nm, the diffusion of metal atoms of first wiring layer 401c into first insulating layer 201 and second nitride semiconductor layer 104 is inhibited by first barrier layer 401a and second barrier layer 401b, and thus it is possible to reduce the generation of a level in first insulating layer 201 and second nitride semiconductor layer 104. It is thus possible to reduce the current collapses while reducing the reverse leakage current of the gate electrode 401. Moreover, by satisfying Z1+Z2≥70 nm, it is possible to further reduce the current collapse while reducing the reverse leakage current of the gate. As a result, it is possible to obtain semiconductor device 100A including gate electrode 401 with high reliability and low on-resistance.

In addition, by satisfying Z1<Z2 as in the present embodiment, the diffusion of metal atoms in first wiring layer 401c is inhibited compared to the conventional technique of PTL 2, and thus processing is facilitated and the residual film variation of first insulating layer 201 is reduced. As a result, it is possible to reduce the electrostatic capacitance variation of field plate electrode 501 and drain electrode 302.

In addition to second barrier layer 401b including TiN or WN, first barrier layer 401a includes TaN which is a higher melting point material, and layer thickness t1 satisfies 50 nm>Z1>3 nm, and thus it is possible to inhibit metal diffusion more than the case where gate electrode 401 includes only second barrier layer 401b.

Embodiment 2

Here, a semiconductor device according to Embodiment 2 will be described with reference to FIG. 14.

Figure 14:
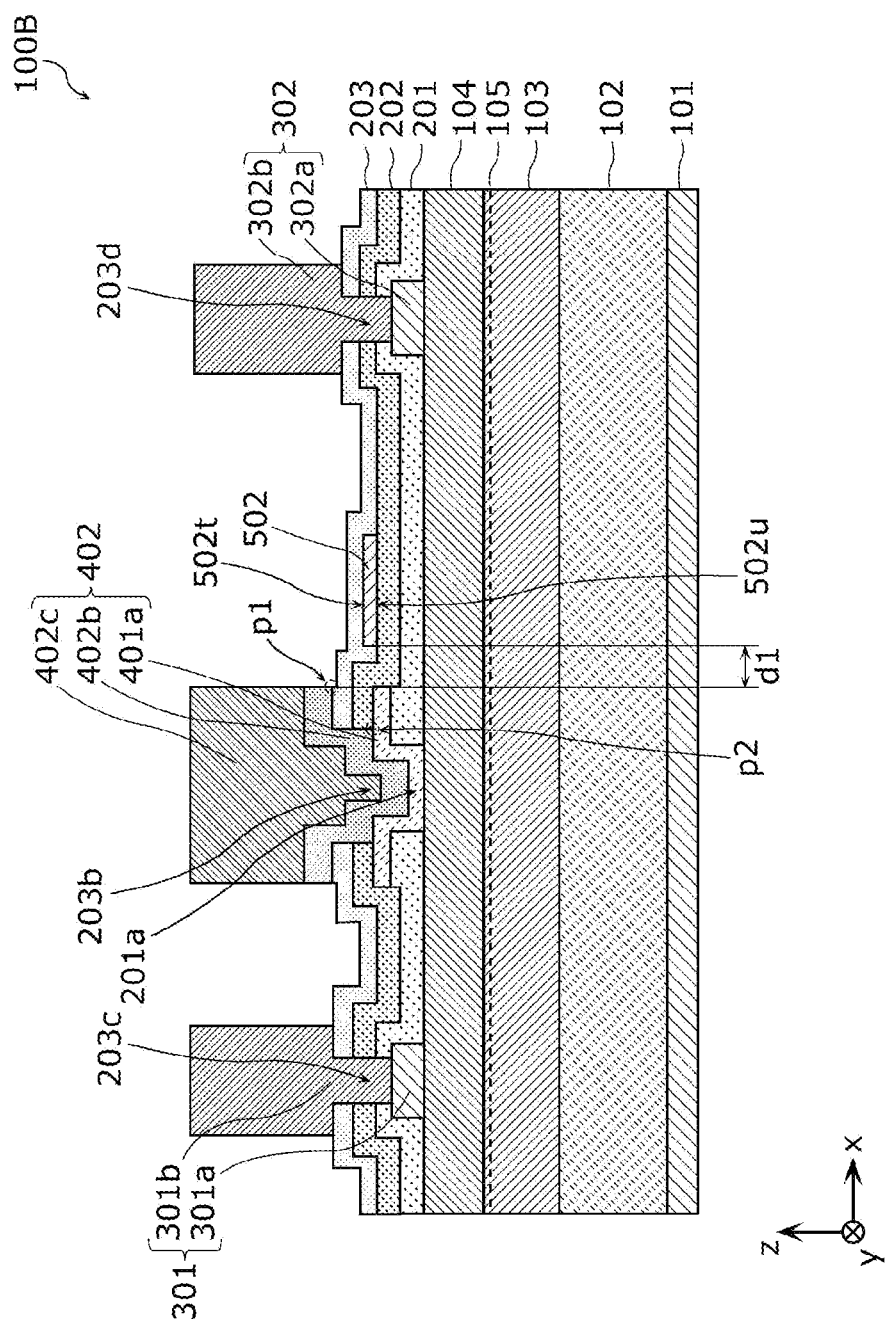
FIG. 14 is a cross-sectional view illustrating a semiconductor device according to Embodiment 2.

FIG. 14 is a cross-sectional view illustrating a configuration of semiconductor device 100B according to Embodiment 2. In the present embodiment, a detailed description of the structural elements common to Embodiment 1 is omitted.

According to the present embodiment, the case where semiconductor device 100B is an HEMT including a Schottky-junction gate electrode will be described.

As illustrated in FIG. 14, semiconductor device 100B includes substrate 101, buffer layer 102, first nitride semiconductor layer 103, second nitride semiconductor layer 104, two-dimensional electron gas layer 105, first insulating layer 201, an opening portion (here, first opening portion 201a), second insulating layer 202, third insulating layer 203, second opening portion 203b, third opening portion 203c, fourth opening portion 203d, source electrode 301 including ohmic electrode 301a and second wiring layer 301b, drain electrode 302 including ohmic electrode 302a and second wiring layer 302b, gate electrode 402 including first barrier layer 401a, second barrier layer 402b, and a wiring layer (here, first wiring layer 402c), and field plate electrode 502.

Field plate electrode 502 is provided above second insulating layer 202 between gate electrode 402 and drain electrode 302. More specifically, field plate electrode 502 is an electrode provided above second insulating layer 202 between first opening portion 201a which is an example of an opening portion and drain electrode 302. In addition, field plate electrode 502 is connected to the electric potential of source electrode 301. In this case, field plate electrode 502 indicates the same electric potential as the electric potential of source electrode 301. In the present embodiment, field plate electrode 502 includes, for example, TiN having a layer thickness of 50 nm. It should be noted that field plate electrode 502 may include, not limited to TiN, a plurality of layers including a lower layer and an upper layer. In this case, the resistivity of the lower layer may be less than the resistivity of the upper layer. Field plate electrode 502 may include Al, Au, Cu, W, Ti, Ta, TiN, TaN, WN, Pt, etc., or a combination of compounds containing these elements.

Third insulating layer 203 is provided to cover the top of second insulating layer 202 and field plate electrode 502. More specifically, third insulating layer 203 is provided to cover field plate electrode 502 above second insulating layer 202 between divergent point p2 and drain electrode 302. According to the present embodiment, third insulating layer 203 includes SiN having a layer thickness of 150 nm, for example.

Second opening portion 203b is formed by removing second insulating layer 202 and third insulating layer 203, and is provided to cover the range of first opening portion 201a in s plan view and to expose first barrier layer 401a. In this case, in the plan view, first opening portion 201a is located to be encompassed by second opening portion 203b which is larger in size.

It should be noted that second opening portion 203b is provided to cover the range of first opening portion 201a in a plan view, but the present disclosure is not limited to this configuration, and the edge portion of second opening portion 203b on a drain electrode 302 side may be located inside first opening portion 201a. In other words, in this case, the size of second opening portion 203b is smaller in a plan view compared to semiconductor device 100B illustrated in FIG. 14. As described above, by reducing the size of second opening portion 203b which can be a path for the metal atoms of first wiring layer 402c to diffuse, it is possible to further reduce the diffusion of metal atoms of first wiring layer 402c into first insulating layer 201 and second nitride semiconductor layer 104 on the drain electrode 302 side.

Second barrier layer 402b and first wiring layer 402c are stacked in stated order. Second barrier layer 402b is disposed above first barrier layer 401a exposed by second opening portion 203b and a portion of third insulating layer 203, in contact with first barrier layer 401a to cover second opening portion 203b. Furthermore, first wiring layer 402c is provided above and in contact with second barrier layer 402b. It should be noted that first wiring layer 402c is an example of the wiring layer disposed above and in contact with second barrier layer 402b. In this manner, gate electrode 402 which includes first barrier layer 401a, second barrier layer 402b, and first wiring layer 402c is formed.

According to the present embodiment, second barrier layer 402b includes, for example, TiN or WN having a layer thickness of 50 nm. First wiring layer 402c includes, for example, Al having a layer thickness of 450 nm.

It should be noted that second barrier layer 402b is not limited to a single layer of TiN or WN, but may have a stacked structure including a plurality of layers including TiN and WN. In addition, First wiring layer 402c is not limited to Al, but may be W, Au, or Cu, or a compound containing these elements, or a multilayer electrode film having a stacked structure including a plurality of layers including these elements.

It should be noted that, when second barrier layer 402b includes TiN, TiN may have an NaCl structure with an N/Ti ratio=1.00 to 1.20. Alternatively, when second barrier layer 402b includes WN, WN may have an NaCl structure with an N/W ratio=0.10. In this manner, second barrier layer 402b is provided above first barrier layer 401a including TaN having an NaCl structure with an N/Ta ratio=1.00 which is oriented only in a (111) plane. As a result, second barrier layer 402b can have a crystal structure oriented only in the (111) plane. In addition, the distance (lattice constant) between neighboring metal atoms of second barrier layer 402b including TiN or WN oriented only in the (111) plane is approximately 0.302 nm for TiN or approximately 0.298 nm for WN. The distance (lattice constant) between neighboring metal atoms of first barrier layer 401a including TaN with an N/Ta ratio=1.00 is 0.315 nm. As described above, since the difference in distance between the neighboring metal atoms is small between second barrier layer 402b and first barrier layer 401a, the formation of a dislocation is less likely to occur in second barrier layer 402b. For that reason, metal diffusion of the metal atoms in first wiring layer 402c through the dislocation in second barrier layer 402b is reduced.

In addition, as a result of second barrier layer 402b having the crystal structure that is an NaCl structure oriented only in the (111) plane, first wiring layer 402c to be provided above second barrier layer 402b can easily have the crystal structure oriented only in the (111) plane. When the layer thickness of first wiring layer 402c is 450 nm and first wiring layer 402c includes Al, the crystal structure of first wiring layer 402c is an FCC-type structure oriented only in the (111) plane, and the distance between neighboring metal atoms is 0.286 nm. In this manner, it is possible to reduce the resistance and enhance the reliability of first wiring layer 402c.

In addition, as in first barrier layer 401a including TaN, second barrier layer 402b including TiN or WN, and first wiring layer 402c including Al, the distance between neighboring metal atoms gradually decreases from the lower layer to the upper layer. As a result, the formation of a dislocation is less likely to occur in first wiring layer 402c. For that reason, it is possible to further reduce the resistance and enhance the reliability of first wiring layer 402c.

Here, the positional relationship between first barrier layer 401a, second barrier layer 402b, second insulating layer 202, and third insulating layer 203 will be explained.

First barrier layer 401a and second barrier layer 402b diverge at divergent point p2 on a path from first opening portion 201a to drain electrode 302. At this time, on the x-axis positive side with respect to divergent point p2, second insulating layer 202 and third insulating layer 203 are sandwiched between first barrier layer 401a and second barrier layer 402b. More specifically, a portion of the stacked body including second insulating layer 202 and third insulating layer 203 is sandwiched between first barrier layer 401a and second barrier layer 402b.

In addition, in the direction perpendicular to the upper surface included in substrate 101, the uppermost surface position of field plate electrode 502 is located below lower end position p1 of the side surface of second barrier layer 402b that is located closest to drain electrode 302. The uppermost surface position of field plate electrode 502 is a position of uppermost surface 502t of field plate electrode 502 illustrated in FIG. 14. In addition, here, the side surface of second barrier layer 402b is the surface of second barrier layer 402b parallel to the yz-plane, and the side surface that is located closest to drain electrode 302 is the side surface from which the distance to drain electrode 302 is shortest. In FIG. 14, lower end position p1 of the side surface of second barrier layer 402b is indicated by a dashed circle. In other words, in this case, as illustrated in FIG. 14, the position of uppermost surface 502t is located below lower end position p1 of the side surface of second barrier layer 402b (z-axis negative side). In this way, the area in which field plate electrode 502 and gate electrode 402 face each other can be reduced, and thus it is possible to reduce the electrostatic capacitance between field plate electrode 502 and gate electrode 402.

In addition, first barrier layer 401a which includes TaN is covered by first insulating layer 201 and second insulating layer 202 which include SiN, and second barrier layer 402b. In addition, second insulating layer 202 includes a material having an oxygen content of 1% or less. This inhibits the oxidation of first barrier layer 401a which includes TaN. In addition, in FIG. 14, closest distance d1 between gate electrode 402 and field plate electrode 502 is indicated. Closest distance d1 means the shortest distance among the gaps between gate electrode 402 and field plate electrode 502. For example, according to the present embodiment, closest distance d1 is the length in the x-axis direction in the cross-sectional view illustrated in FIG. 14, and is the gap between gate electrode 402 and field plate electrode 502. Closest distance d1 is at least 100 nm. It is preferable that closest distance d1 is 200 nm or more, and more preferable that closest distance d1 is 300 nm or more. In this manner, it is possible to sufficiently enhance the ESD breakdown voltage of gate electrode 402 and field plate electrode 502. Furthermore, it is preferable that closest distance d1 is 1000 nm or less, more preferable that closest distance d1 is 900 nm or less, and yet more preferable that closest distance d1 is 800 nm or less. This facilitates the downsizing of semiconductor device 100B.

It should be noted that, according to the present embodiment, in the direction perpendicular to the upper surface included in substrate 101, the lowermost surface position of field plate electrode 502 is located below lower end position p1 of the side surface of second barrier layer 402b that is located closest to drain electrode 302. The lowermost surface position of field plate electrode 502 is a position of lowermost surface 502u of field plate electrode 502 illustrated in FIG. 14. In other words, in this case, as illustrated in FIG. 14, the position of lowermost surface 502u is located below lower end position p1 of the side surface of second barrier layer 402b (z-axis negative side). In this manner, it is possible to further achieve electric field relaxation at the lower end of first barrier layer 401a which is located closest to drain electrode 302.

Third opening portion 203c and fourth opening portion 203d are formed by removing first insulating layer 201, second insulating layer 202, and third insulating layer 203 such that a portion of ohmic electrode 301a and a portion of ohmic electrode 302a are exposed.

Second wiring layer 301b is disposed above ohmic electrode 301a exposed by third opening portion 203c and a portion of third insulating layer 203, to cover third opening portion 203c. In the same manner as above, second wiring layer 302b is disposed above ohmic electrode 302a exposed by fourth opening portion 203d and a portion of third insulating layer 203, to cover fourth opening portion 203d. According to the present embodiment, second wiring layer 301b and second wiring layer 302b each include, for example, TiN having a layer thickness of 200 nm, Al having a layer thickness of 3000 nm, and TiN having a layer thickness of 50 nm. It should be noted that second wiring layer 301b and second wiring layer 302b are not limited to Al, but may be each W, Au, or Cu in place of Al, or a compound containing these elements, or a multilayer electrode film having a stacked structure including a plurality of layers including these elements.

As described above, semiconductor device 100B according to the present embodiment includes third insulating layer 203, and second insulating layer 202 and third insulating layer 203 are sandwiched between first barrier layer 401a and second barrier layer 402b. With semiconductor device 100B having such a structure as described above, since second insulating layer 202 and third insulating layer 203 are designed independently, the degree of freedom in the structural design of semiconductor device 100B is high in terms of the ESD breakdown voltage and an electric field design. Furthermore, since third insulating layer 203 is inserted between first barrier layer 401a and second barrier layer 402b, the electrostatic capacitance between field plate electrode 502 and gate electrode 402 is small, and thus it is possible to obtain gate electrode 402 with high reliability and low on-resistance characteristics.

It should be noted that the permittivity of the material included in third insulating layer 203 may be smaller than the permittivity of the material included in second insulating layer 202. The material included in third insulating layer 203 may be $SiO_2$, SION, SiC, or SiCN, for example, and may be selected according to the permittivity of the material included in second insulating layer 202. In this way, it is possible to reduce the electrostatic capacitance between field plate electrode 502 and gate electrode 402.

The layer thickness of second insulating layer 202 may be less than the layer thickness of third insulating layer 203. With the configuration described above, it is possible to achieve electric field relaxation at the end portion of first barrier layer 401a on the drain electrode 302 side.

It should be noted that at least one of first barrier layer 401a or second barrier layer 402b may be bilaterally asymmetric. In other words, at least one of the shape of first barrier layer 401a or the shape of second barrier layer 402b need not necessarily be axisymmetric about the symmetry line that passes through the center of the opening portion (here, first opening portion 201a) and is parallel to the z-axis. With the configuration described above, the degree of freedom in the structural design of field plate electrode 502 is enhanced.

The following describes such a shape as described above, with reference to FIG. 15 to FIG. 19.

Figure 15:
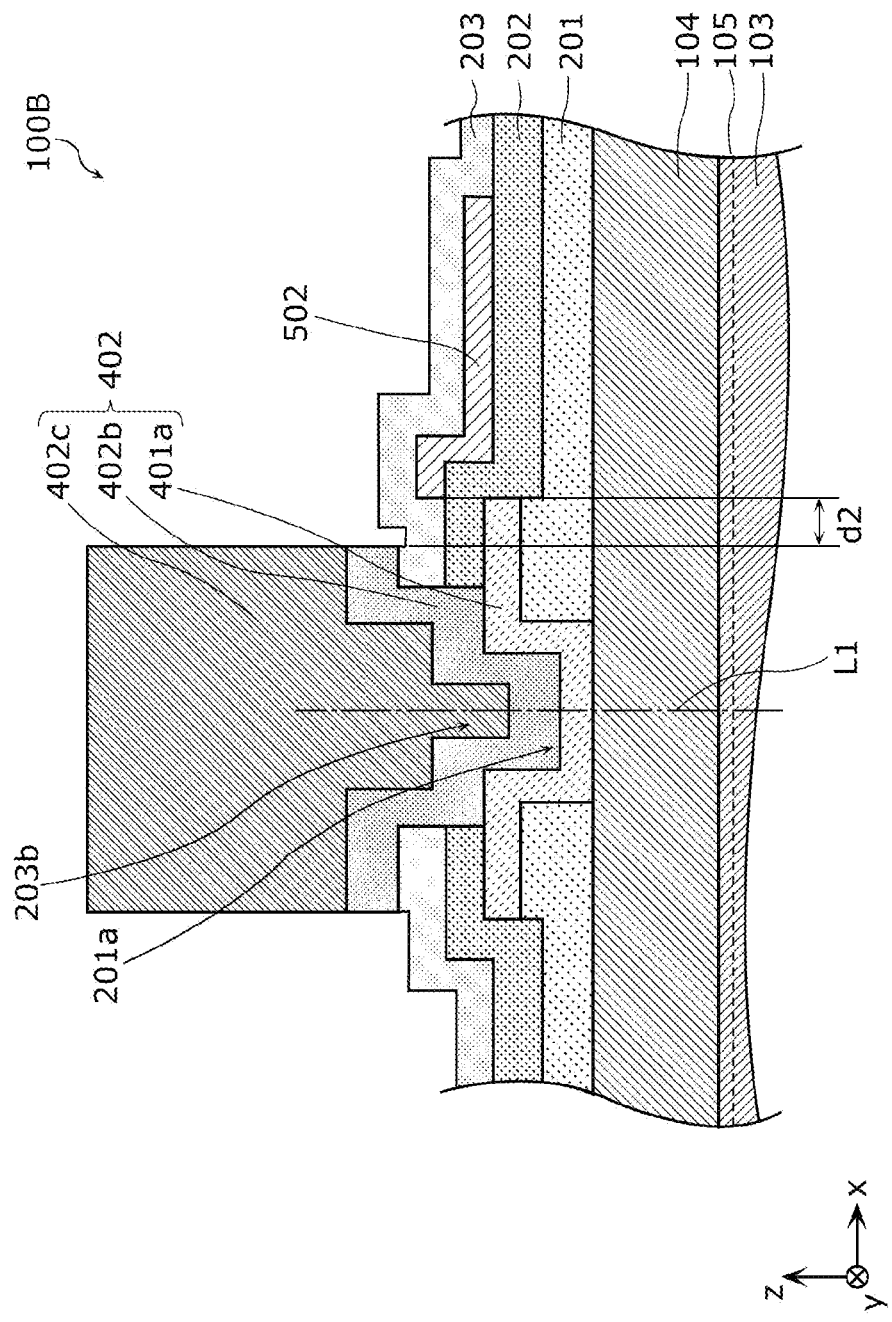
FIG. 15 is a cross-sectional view illustrating a configuration of a semiconductor device in proximity to a gate electrode according to Variation 1 of Embodiment 2.

First, description will be provided with referenced to FIG. 15.

FIG. 15 is a cross-sectional view illustrating a configuration of semiconductor device 100B in proximity to gate electrode 402 according to Variation 1 of Embodiment 2.

Semiconductor device 100B according to Variation 1 of Embodiment 2 has the same configuration as the configuration of semiconductor device 100B according to Embodiment 2, mainly except that field plate electrode 502 has a staircase shape and the shape of second barrier layer 402b is bilaterally asymmetric.

In FIG. 15, symmetry line L1 that passes through the center of the above-described first opening portion 201a and is parallel to the z-axis is illustrated. The shape of second barrier layer 402b is not axisymmetric about the above-described symmetry line L1, for example, in the cross-sectional view illustrated FIG. 15. In this case, in second barrier layer 402b, the extension length in the direction from the center of first opening portion 201a toward source electrode 301 and the extension length in the direction from the center toward drain electrode 302 differ. The direction from the center toward source electrode 301 is the x-axis negative direction, and the extension length in the x-axis negative direction is the length from symmetry line L1 to the end portion of second barrier layer 402b on the source electrode 301 side. The direction from the center toward drain electrode 302 is the x-axis positive direction, and the extension length in the x-axis positive direction is the length from symmetry line L1 to the end portion of second barrier layer 402b on the drain electrode 302 side. As described above, in at least one of first barrier layer 401a or second barrier layer 402b (here, second barrier layer 402b), the extension length in the direction from the center of first opening portion 201a toward source electrode 301 and the extension length in the direction from the center toward drain electrode 302 differ. With the configuration described above, the degree of freedom in the structural design of field plate electrode 502 is enhanced.

In addition, in a plan view of substrate 101, the distance between first barrier layer 401a and field plate electrode 502 may be shorter than distance d2 between second barrier layer 402b and field plate electrode 502. More specifically, distance d2 between second barrier layer 402b and field plate electrode 502 is the length in the x-axis direction illustrated in FIG. 15. It should be noted that, since the end portion of first barrier layer 401a on the x-axis positive side and the end portion of field plate electrode 502 on the x-axis negative side overlap in a plan view, the distance between first barrier layer 401a and field plate electrode 502 is zero here. In this way, since the distance between second barrier layer 402b and drain electrode 302 increases, it is possible to reduce the electrostatic capacitance between drain electrode 302 and gate electrode 402.

Figure 16:
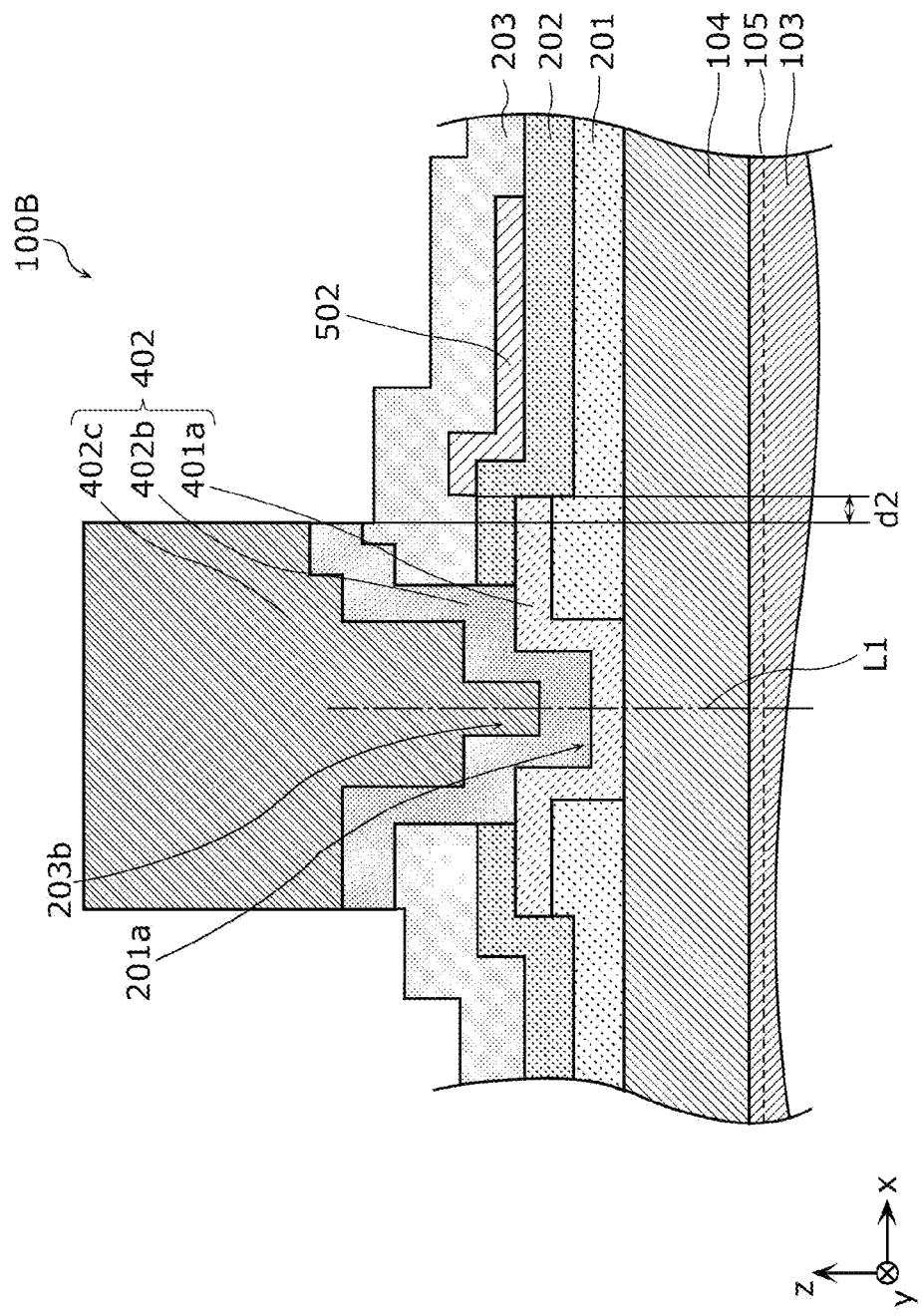
FIG. 16 is a cross-sectional view illustrating a configuration of a semiconductor device in proximity to a gate electrode according to Variation 2 of Embodiment 2.

In addition, description will be provided with referenced to FIG. 16.

FIG. 16 is a cross-sectional view illustrating a configuration of semiconductor device 100B in proximity to gate electrode 402 according to Variation 2 of Embodiment 2.

Semiconductor device 100B according to Variation 2 of Embodiment 2 has the same configuration as the configuration of semiconductor device 100B according to Variation 1 of Embodiment 2, mainly except that the shape of second barrier layer 402b is different.

As illustrated in FIG. 16, the shape of second barrier layer 402b is not axisymmetric about the above-described symmetry line L1, for example, in the cross-sectional view illustrated FIG. 16. In addition, second barrier layer 402b has a staircase shape on the x-axis negative side from the center of first opening portion 201a (e.g., symmetry line L1) and on the x-axis positive side from the center of first opening portion 201a (e.g., symmetry line L1). Here, a total number of steps of the staircase differs between the staircase shape on the x-axis negative side from the center of first opening portion 201a and the staircase shape on the x-axis positive side from the center of first opening portion 201a.

In addition, in the same manner as semiconductor device 100B according to Variation 1 of Embodiment 2 as illustrated in FIG. 15, in a plan view of substrate 101, the distance between first barrier layer 401a and field plate electrode 502 may be shorter than distance d2 between second barrier layer 402b and field plate electrode 502 in semiconductor device 100B according to Variation 2 of Embodiment 2. In this way, since the distance between second barrier layer 402b and drain electrode 302 increases, it is possible to reduce the electrostatic capacitance between drain electrode 302 and gate electrode 402.

Figure 17:
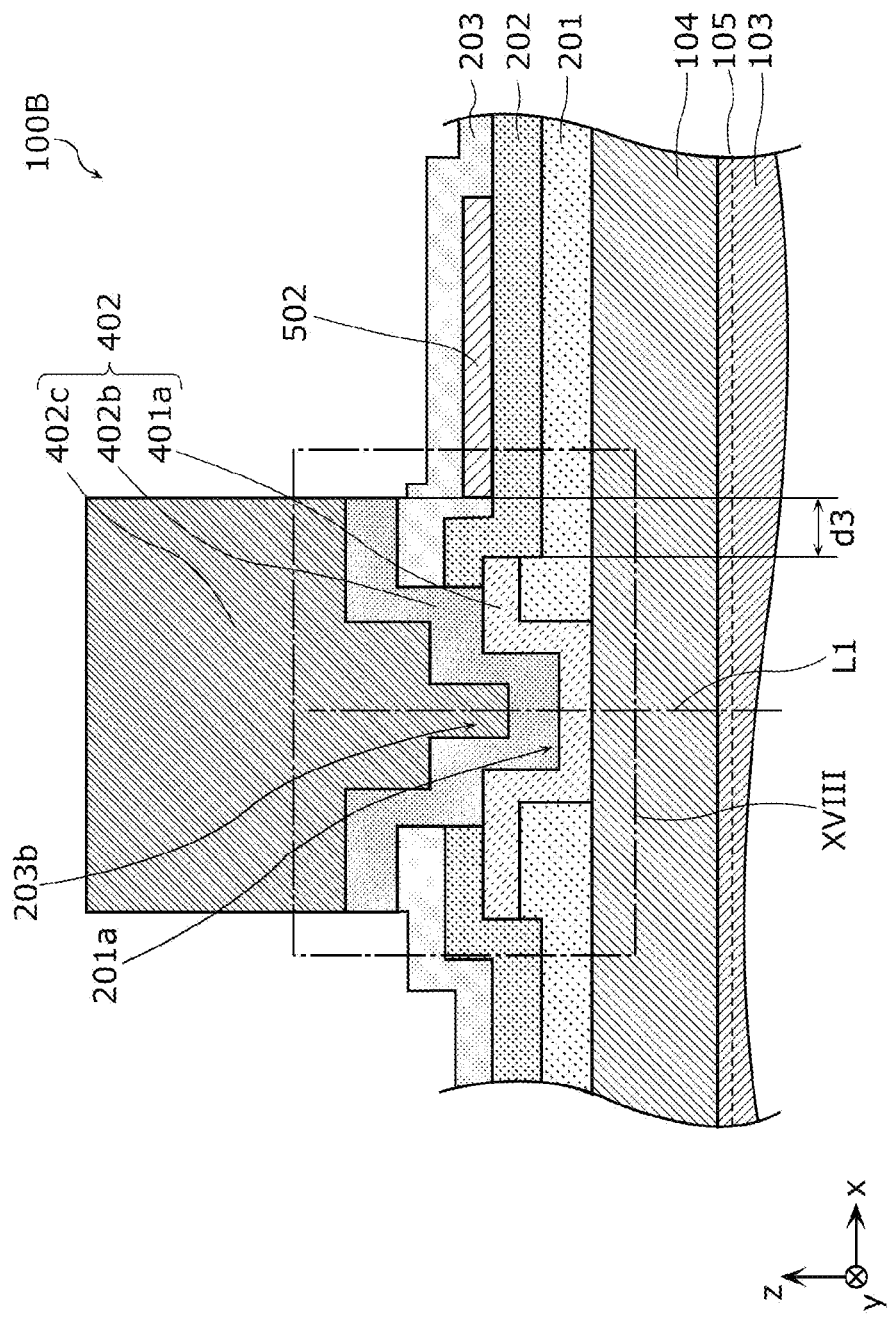
FIG. 17 is a cross-sectional view illustrating a configuration of a semiconductor device in proximity to a gate electrode according to Variation 3 of Embodiment 2.
Figure 18:
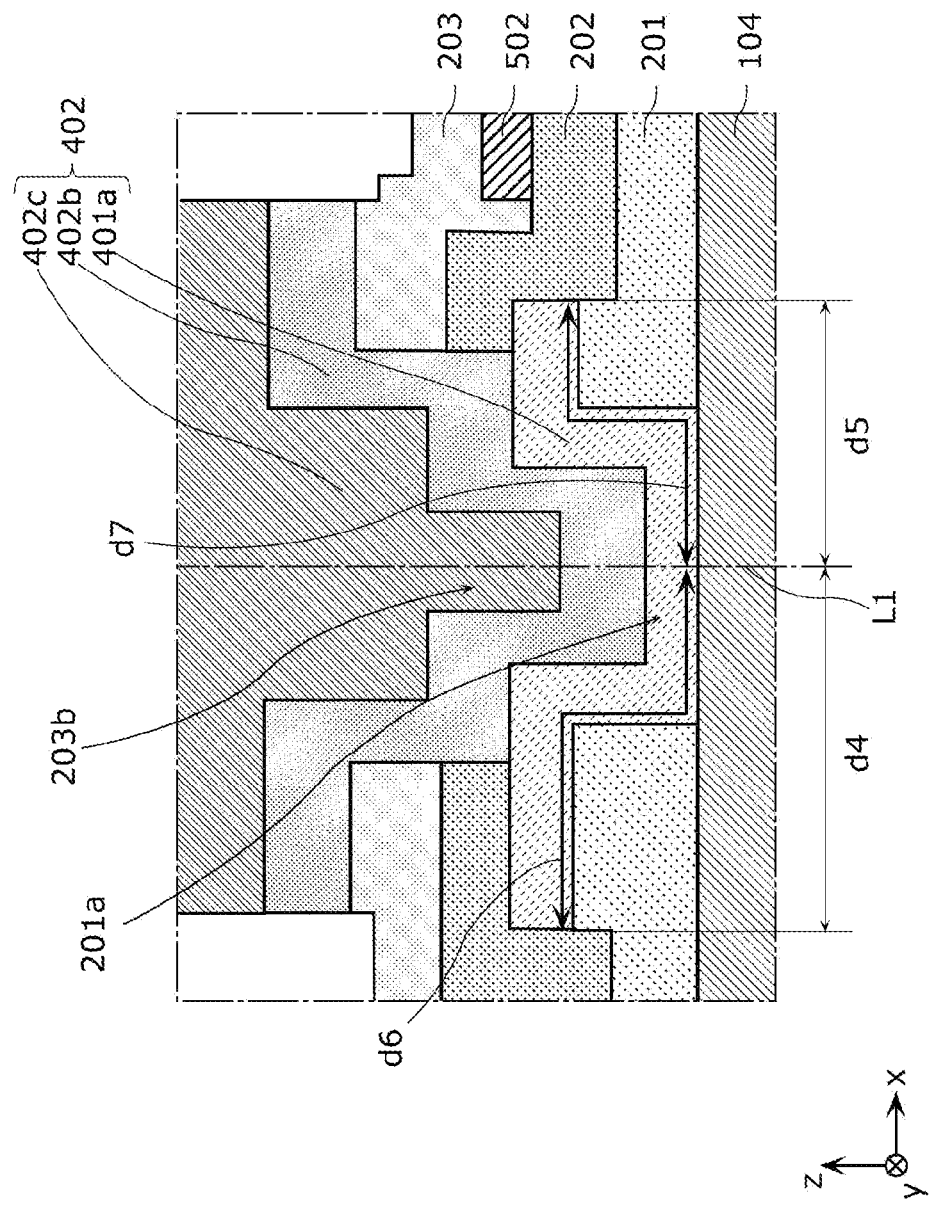
FIG. 18 is a cross-sectional view illustrating region XVIII of FIG. 17 enlarged.

In addition, description will be provided with referenced to FIG. 17 and FIG. 18.

FIG. 17 is a cross-sectional view illustrating a configuration of semiconductor device 100B in proximity to gate electrode 402 according to Variation 3 of Embodiment 2. FIG. 18 is a cross-sectional view illustrating region XVIII of FIG. 17 enlarged.

Semiconductor device 100B according to Variation 3 of Embodiment 2 has the same configuration as the configuration of semiconductor device 100B according to Embodiment 2, mainly except that the shape of first barrier layer 401a is bilaterally asymmetric.

In FIG. 17 and FIG. 18, symmetry line L1 is illustrated. The shape of first barrier layer 401a is not axisymmetric about the above-described symmetry line L1, for example, in the cross-sectional view illustrated FIG. 17 and FIG. 18. More specifically, in first barrier layer 401a, the extension length in the direction from the center of first opening portion 201a toward source electrode 301 (hereinafter referred to as a first extension length) and the extension length in the direction from the center toward drain electrode 302 (hereinafter referred to as a second extension length) differ. As illustrated in FIG. 18, as an example, the first extension length and the second extension length are length d4 and length d5, respectively. In this case, the first extension length is distance d4 which is the length along the x-axis negative direction that is the direction from the center of first opening portion 201a (e.g., symmetry line L1) toward source electrode 301, and the second extension length is distance d5 which is the length along the x-axis positive direction that is the direction from the center of first opening portion 201a (e.g., symmetry line L1) toward drain electrode 302. In addition, as illustrated in FIG. 18, as an example, the first extension length and the second extension length are length d6 and length d7, respectively. In this case, the first extension length is distance d6 which is the length along the step of the staircase shape of first barrier layer 401a located on the x-axis negative side with respect to symmetry line L1, and the second extension length is distance d7 which is the length along the step of the staircase shape of first barrier layer 401a located on the x-axis positive side with respect to symmetry line L1. As described above, the first extension length and the second extension length may satisfy distance d4>distance d5, or distance d6>distance d7. As illustrated in FIG. 17 and FIG. 18, in first barrier layer 401a, the extension length in the direction from the center of first opening portion 201a toward source electrode 301 (first extension length) and the extension length in the direction from the center toward drain electrode 302 (second extension length) differ. With the configuration described above, the degree of freedom in the structural design of field plate electrode 502 is enhanced.

In addition, in a plan view of substrate 101, distance d3 between first barrier layer 401a and field plate electrode 502 may be longer than the distance between second barrier layer 402b and field plate electrode 502. More specifically, distance d3 between first barrier layer 401a and field plate electrode 502 is the length in the x-axis direction illustrated in FIG. 17. It should be noted that, since the end portion of second barrier layer 402b on the x-axis positive side and the end portion of field plate electrode 502 on the x-axis negative side overlap in a plan view, the distance between second barrier layer 402b and field plate electrode 502 is zero here. With the configuration described above, the width of second barrier layer 402b and the width of first wiring layer 402c are enlarged on the drain electrode 302 side, and thus it is possible to reduce the wiring resistance of gate electrode 402. In addition, since the shape of field plate electrode 502 is flattened, it is possible to reduce the electrostatic capacitance between field plate electrode 502 and gate electrode 402.

Figure 19:
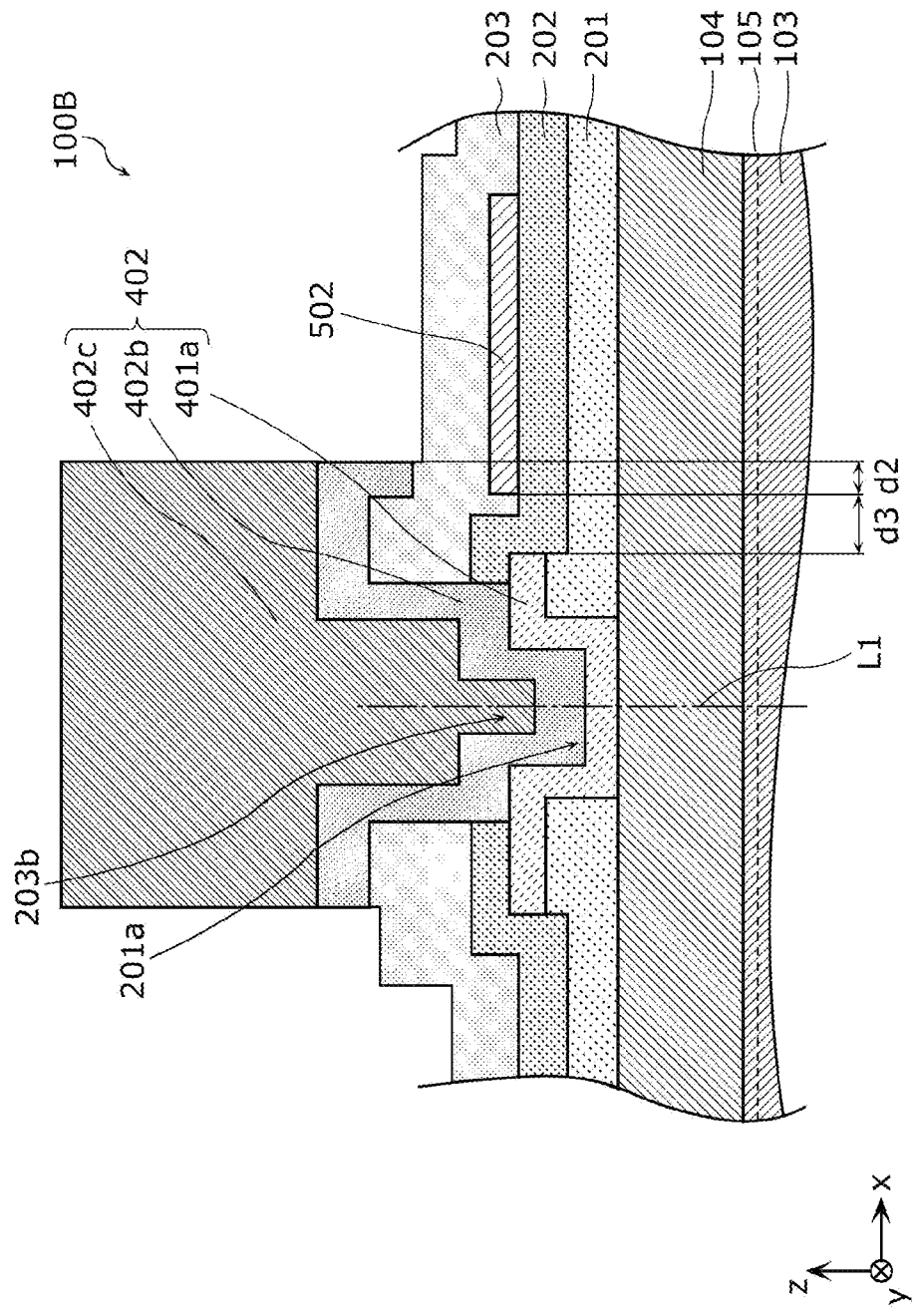
FIG. 19 is a cross-sectional view illustrating a configuration of a semiconductor device in proximity to a gate electrode according to Variation 4 of Embodiment 2.
Figure 20:
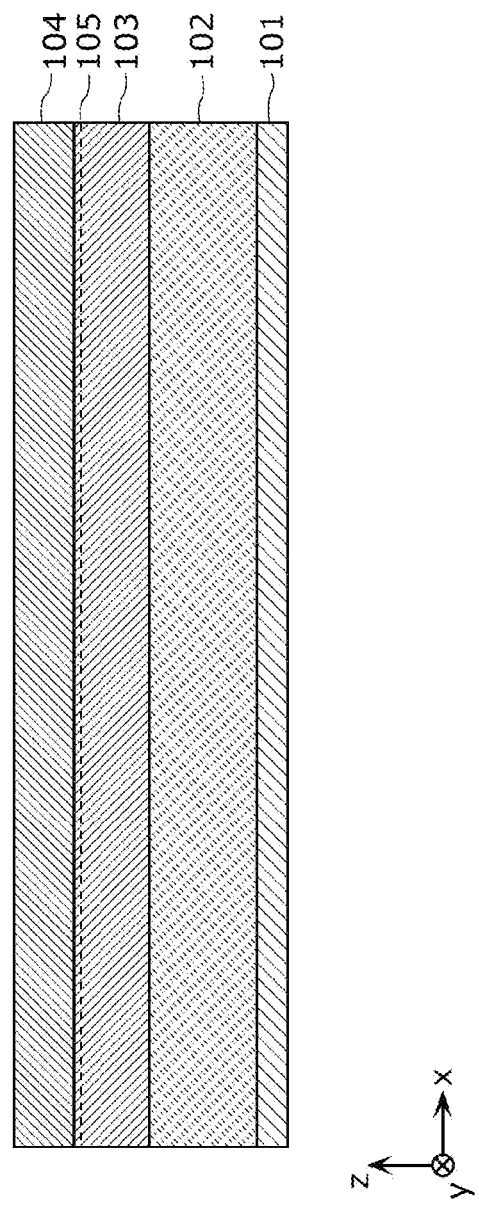
FIG. 20 is a cross-sectional view illustrating a manufacturing process of the semiconductor device according to Embodiment 2.
Figure 21:
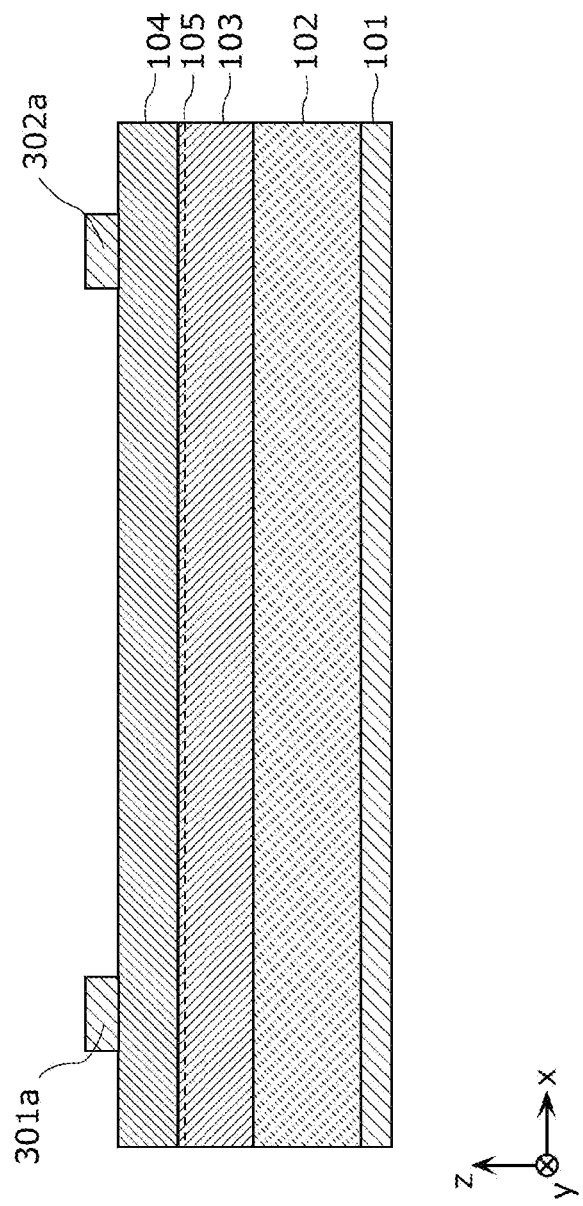
FIG. 21 is a cross-sectional view illustrating a manufacturing process of the semiconductor device according to Embodiment 2.
Figure 22:
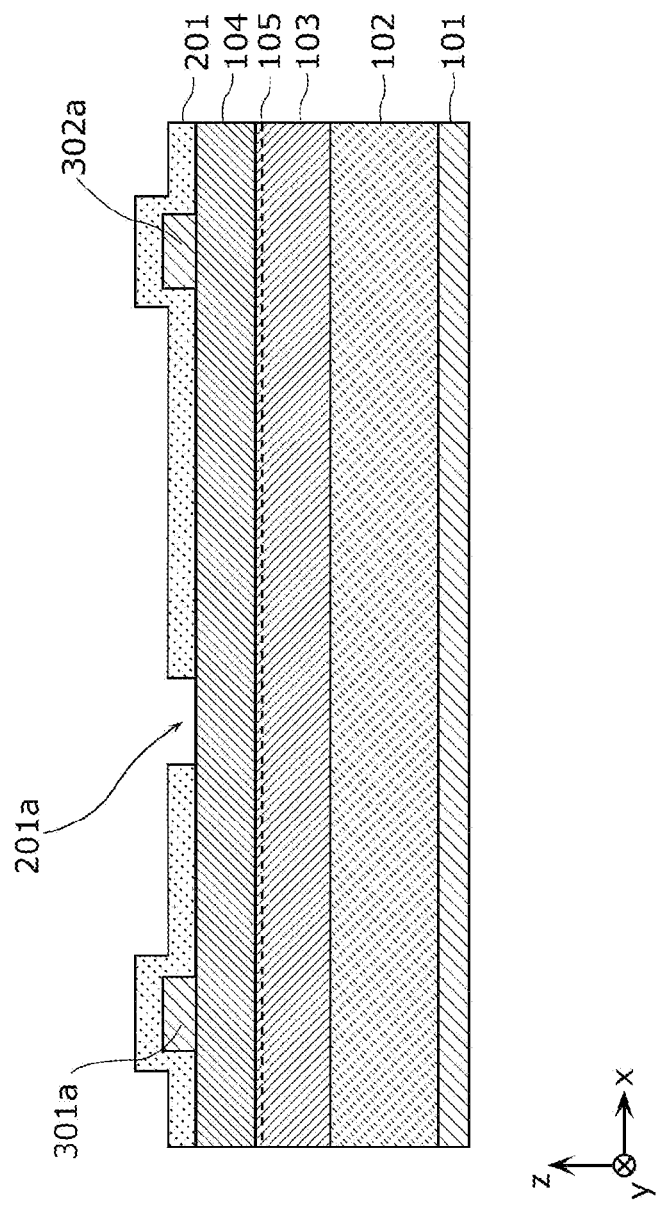
FIG. 22 is a cross-sectional view illustrating a manufacturing process of the semiconductor device according to Embodiment 2.
Figure 23:
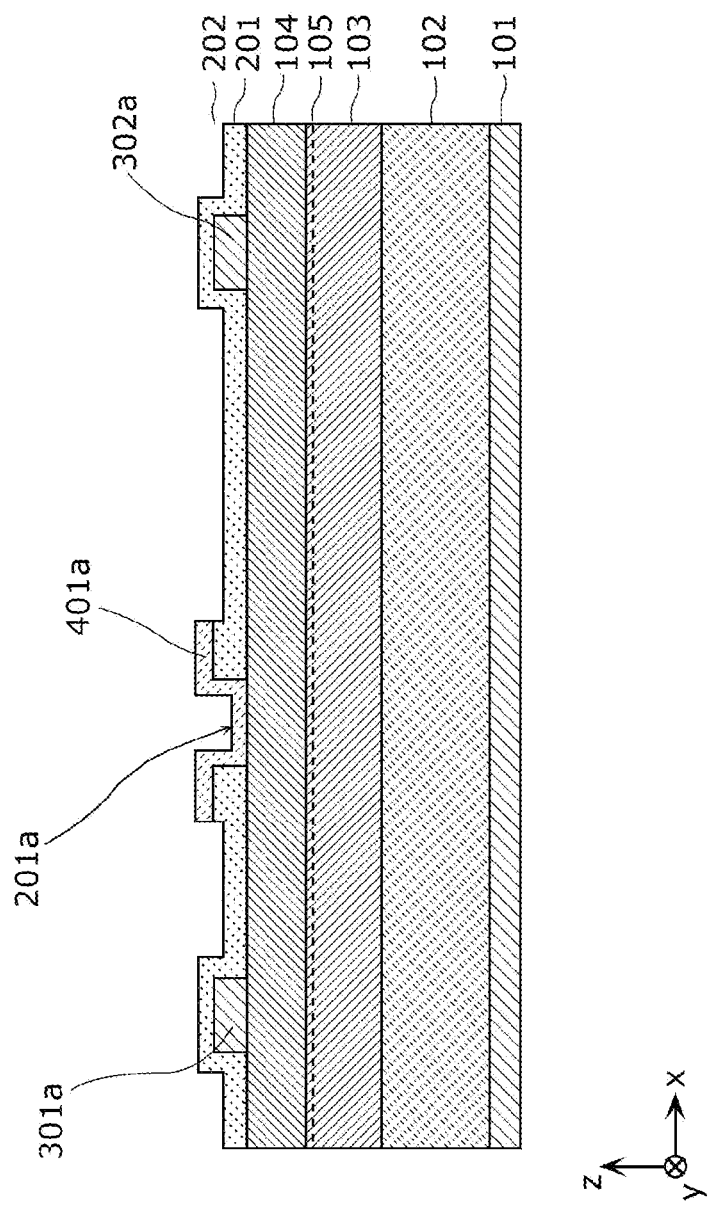
FIG. 23 is a cross-sectional view illustrating a manufacturing process of the semiconductor device according to Embodiment 2.

In addition, description will be provided with referenced to FIG. 19.

FIG. 19 is a cross-sectional view illustrating a configuration of semiconductor device 100B in proximity to gate electrode 402 according to Variation 4 of Embodiment 2.

Semiconductor device 100B according to Variation 4 of Embodiment 2 has the same configuration as the configuration of semiconductor device 100B according to Variation 3 of Embodiment 2, mainly except that the shape of second barrier layer 402b is different. As illustrated in FIG. 19, distance d3 between first barrier layer 401a and field plate electrode 502 may be longer than distance d2 between second barrier layer 402b and field plate electrode 502. In this case, the width of second barrier layer 402b and the width of first wiring layer 402c are further enlarged on the drain electrode 302 side, and thus it is possible to reduce the wiring resistance of gate electrode 402. As described above, when the wiring resistance of gate electrode 402 is to be reduced, the electrostatic capacitance of field plate electrode 502 and gate electrode 402 increases. Therefore, by increasing the layer thickness of third insulating layer 203, it is possible to design the configuration to avoid an increase in the electrostatic capacitance of field plate electrode 502 and gate electrode 402.

The following describes the manufacturing method of semiconductor device 100B according to the present embodiment with reference to FIG. 20 to FIG. 28. FIG. 20 to FIG. 28 each illustrate a cross-sectional view indicating a configuration of semiconductor device 100B during the manufacturing process.

First, FIG. 20 to FIG. 23 are equivalent to FIG. 6 to FIG. 9 illustrated in Embodiment 1, and thus a detailed explanation will be omitted.

Figure 24:
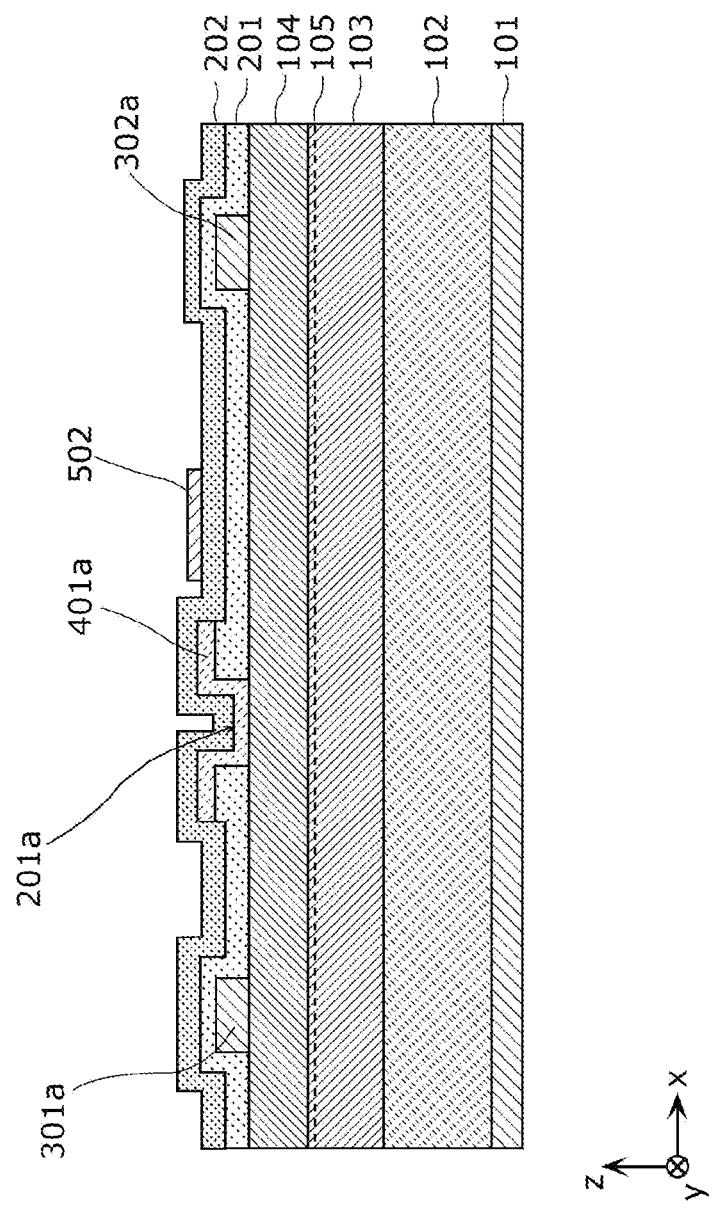
FIG. 24 is a cross-sectional view illustrating a manufacturing process of the semiconductor device according to Embodiment 2.

Next, as illustrated in FIG. 24, second insulating layer 202 including SiN and having a layer thickness of 150 nm is deposited by the plasma CVD method, and then TiN having a layer thickness of 50 nm is sequentially deposited by the sputtering method. After that, resist is applied in a region in which field plate electrode 502 is to be formed, and then the resist is patterned using the lithography method to form a mask. Then, field plate electrode 502 is formed using the dry etching method.

Figure 25:
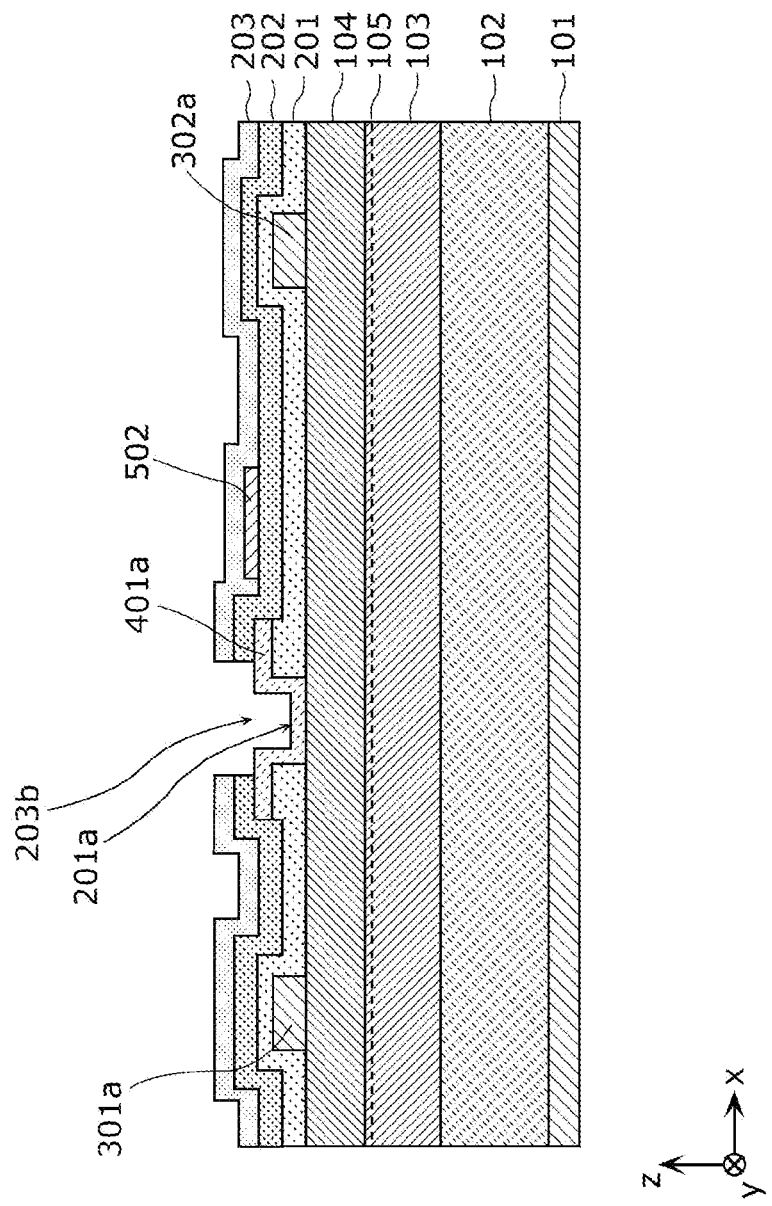
FIG. 25 is a cross-sectional view illustrating a manufacturing process of the semiconductor device according to Embodiment 2.

Next, as illustrated in FIG. 25, third insulating layer 203 including SiN and having a layer thickness of 150 nm is deposited by the plasma CVD method. After that, resist is applied in a region other than the region in which gate electrode 402 is to be formed, and then the resist is patterned using the lithography method to form a mask. Next, second opening portion 203b is formed using the dry etching method such that first barrier layer 401a is exposed.

Figure 26:
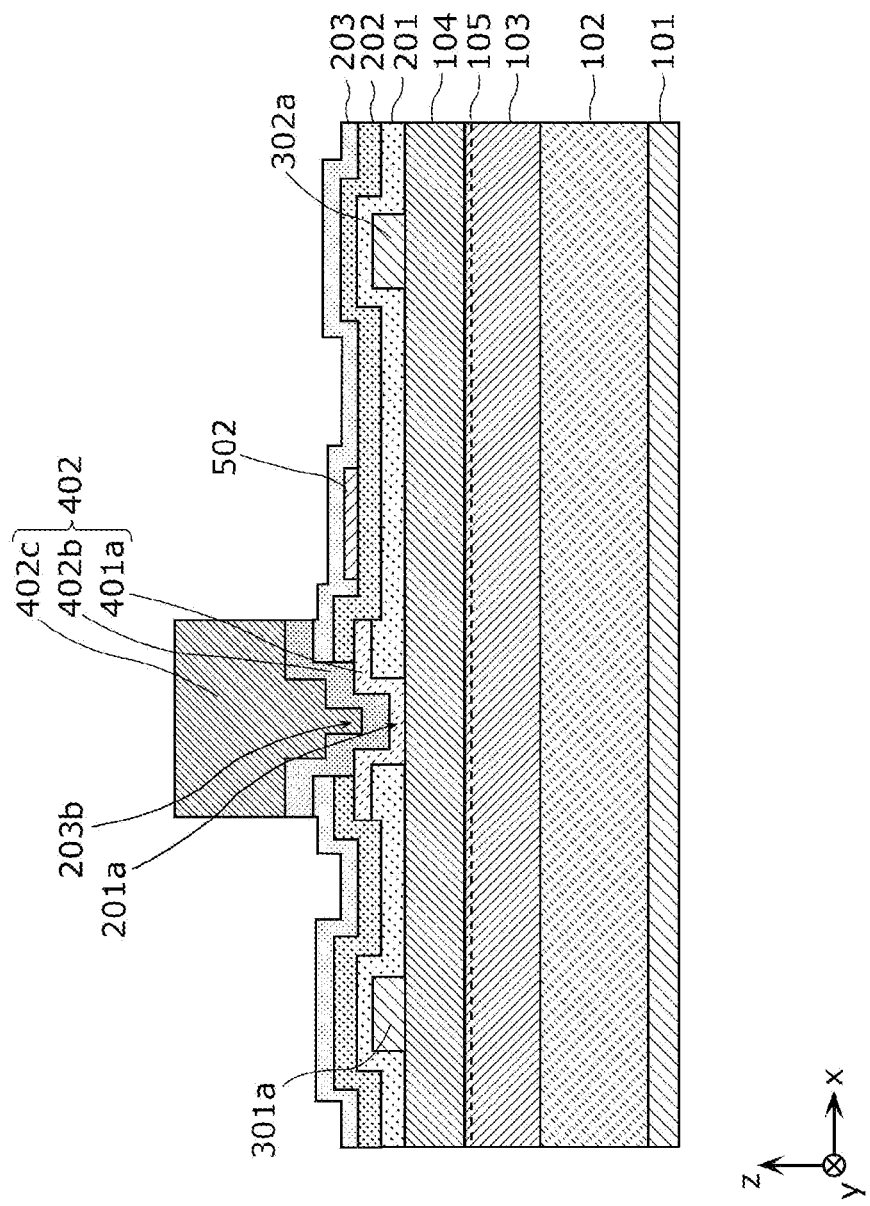
FIG. 26 is a cross-sectional view illustrating a manufacturing process of the semiconductor device according to Embodiment 2.

Next, as illustrated in FIG. 26, second barrier layer 402b including TiN having a layer thickness of 50 nm and first wiring layer 402c including Al having a layer thickness of 450 nm are deposited in sequence by the sputtering method. After that, resist is applied in the region in which gate electrode 402 is to be formed, and then the resist is patterned using the lithography method to form a mask. Next, second barrier layer 402b and first wiring layer 402c are patterned using the dry etching method. In the above-described manner, gate electrode 402 is formed.

Figure 27:
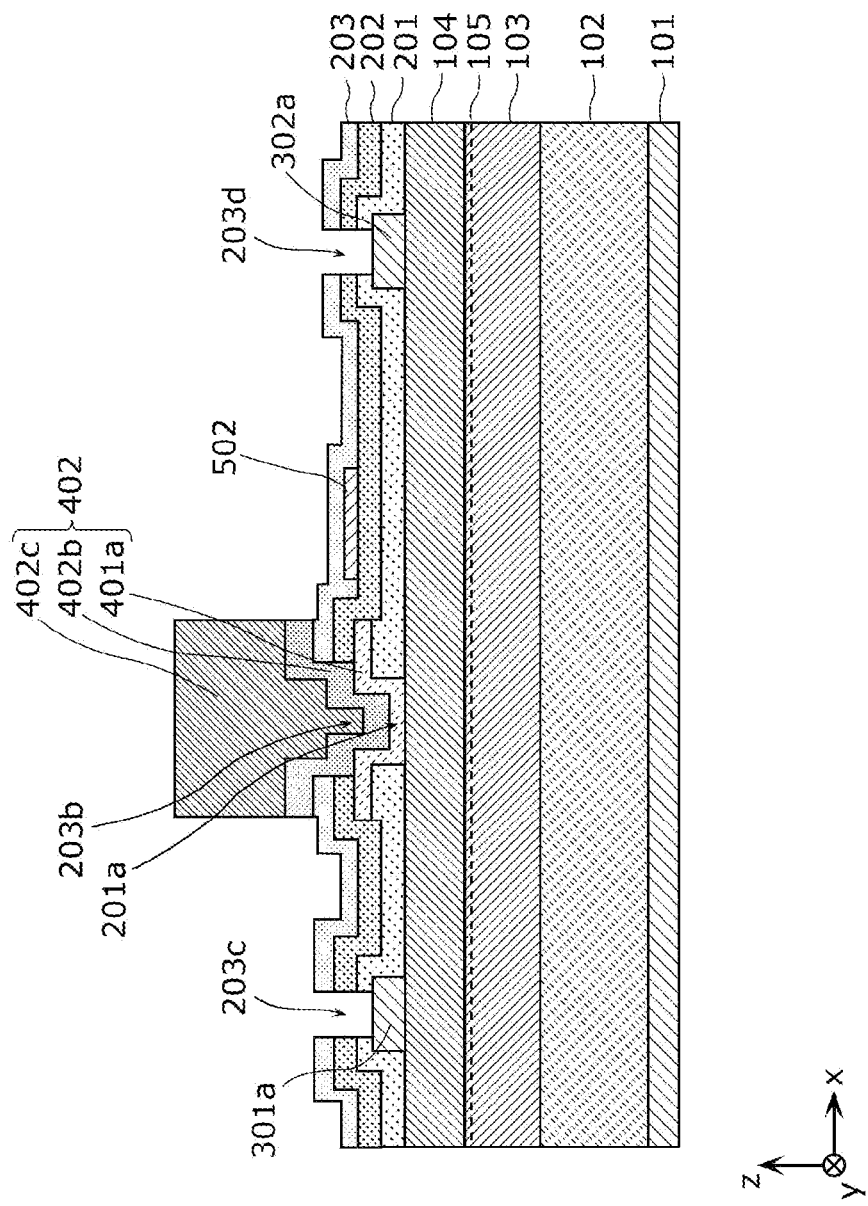
FIG. 27 is a cross-sectional view illustrating a manufacturing process of the semiconductor device according to Embodiment 2.

Next, As illustrated in FIG. 27, resist is applied in a region other than the region in which source electrode 301 and drain electrode 302 are to be formed, and then the resist is patterned using the lithography method to form a mask. Next, third opening portion 203c and fourth opening portion 203d are formed using the dry etching method such that ohmic electrode 301a and ohmic electrode 302a are exposed.

Figure 28:
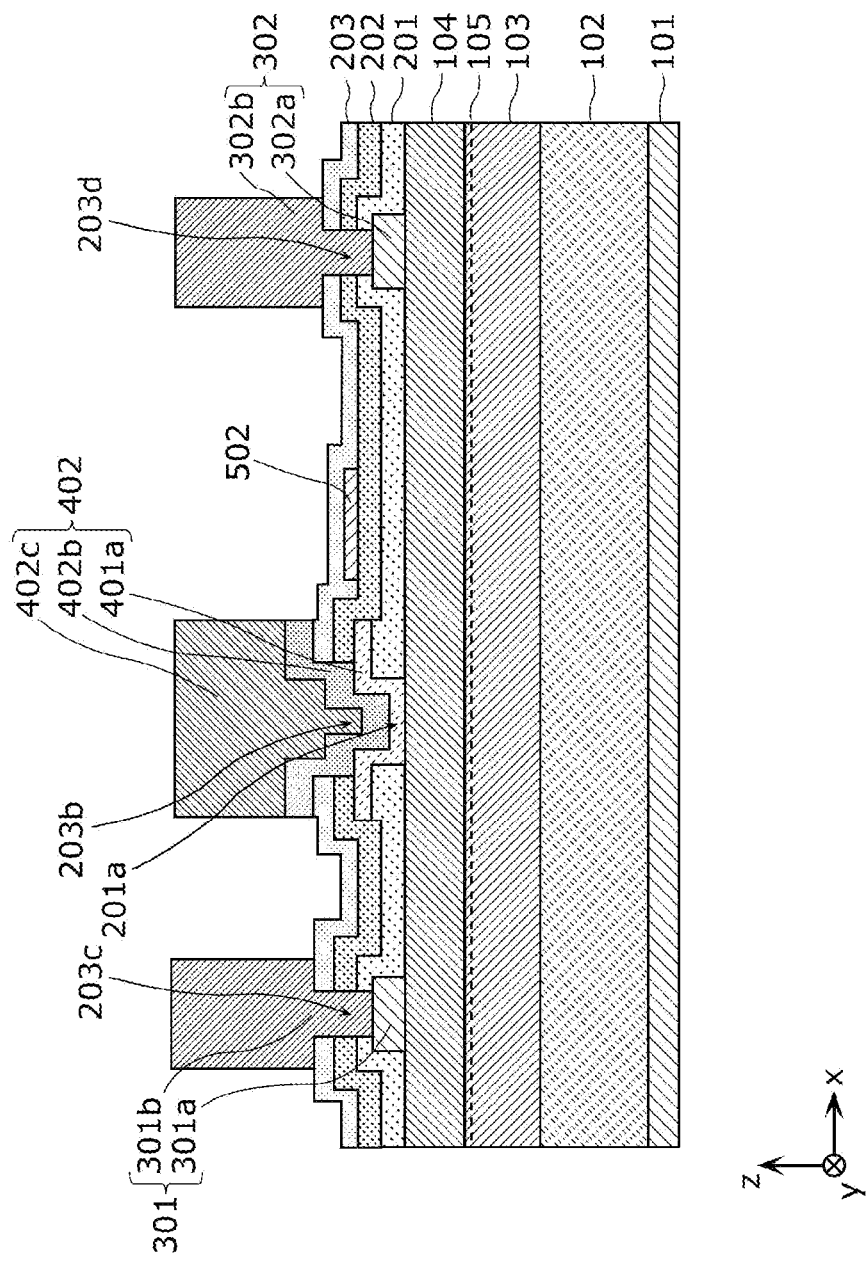
FIG. 28 is a cross-sectional view illustrating a manufacturing process of the semiconductor device according to Embodiment 2.
Figure 29:
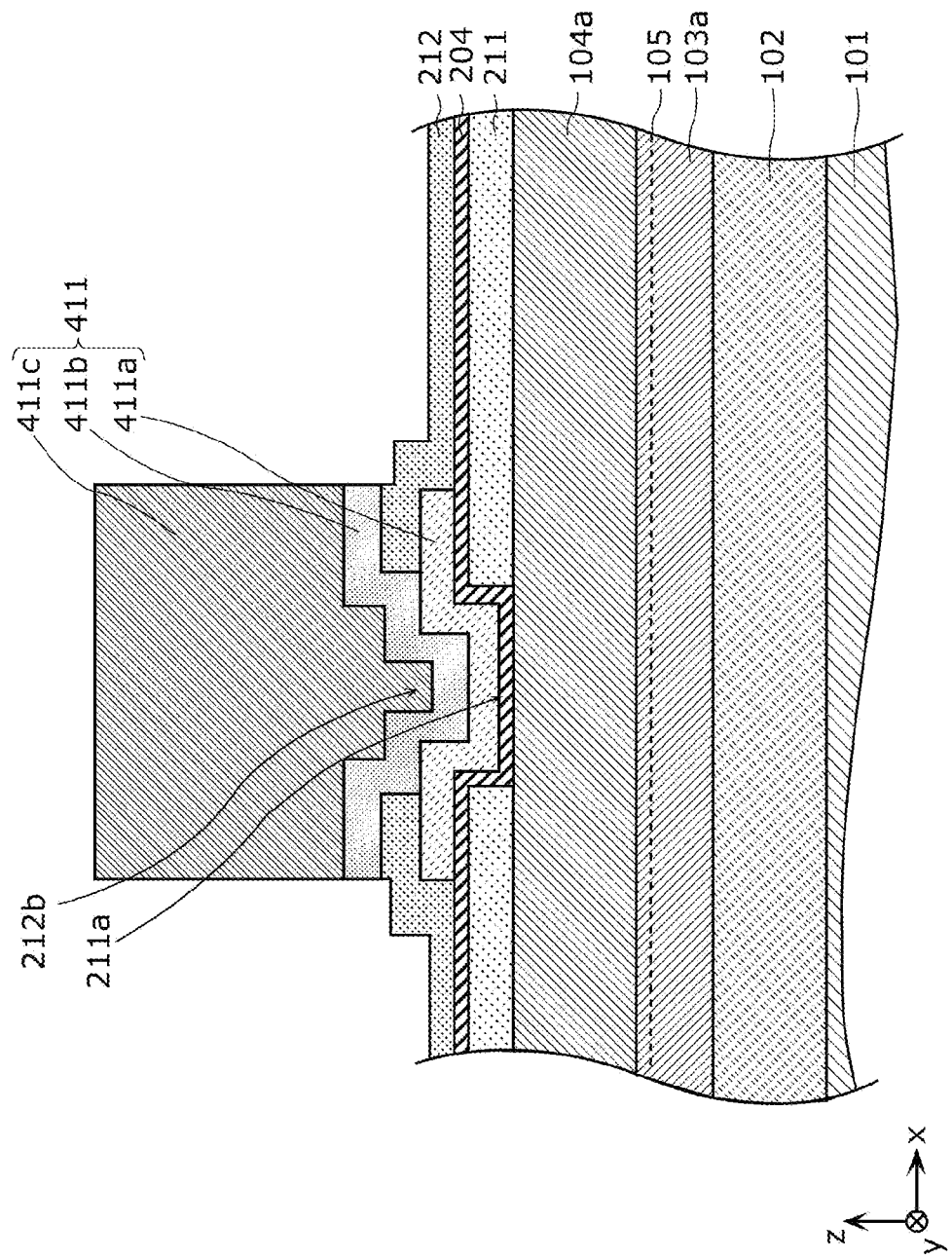
FIG. 29 is a cross-sectional view illustrating a configuration of a semiconductor device in proximity to a gate electrode according to PTL 2.

Next, as illustrated in FIG. 28, TiN having a layer thickness of 200 nm, Al having a layer thickness of 3000 nm, and TiN having a layer thickness of 50 nm are deposited in sequence by the sputtering method. Then, resist is applied in a region in which source electrode 301 and drain electrode 302 are to be formed, and then the resist is patterned using the lithography method to form a mask. Next, second wiring layer 301b and second wiring layer 302b are patterned using the dry etching method. In the above-described manner, source electrode 301 and drain electrode 302 are formed. It should be noted that second wiring layer 301b and second wiring layer 302b may each be formed as wiring using Au or Cu, not only by the dry etching method but also by the plating or damascene method.

By going through the series of the processes as described above, the manufacturing of semiconductor device 100B that has the configuration illustrated in FIG. 14 is completed.

In semiconductor device 100B formed as described above, the area in which field plate electrode 502 and gate electrode 402 face each other can be reduced, and thus it is possible to reduce the electrostatic capacitance of field plate electrode 502 and gate electrode 402. For that reason, it is possible to obtain semiconductor device 100B including gate electrode 402 having low electrostatic capacitance between field plate electrode 502 and gate electrode 402, and high reliability and low on-resistance characteristics.

Other Embodiments

Although the semiconductor device according to the present disclosure has been described based on the embodiments thus far, the present disclosure is not limited to the embodiments described above.

For example, as illustrated in FIG. 15 to FIG. 19 in Embodiment 2, at least one of first barrier layer 401a or second barrier layer 402b may be bilaterally asymmetric. The same is true in Embodiment 1, and at least one of first barrier layer 401a or second barrier layer 401b may be bilaterally asymmetric. With the configuration described above, the degree of freedom in the structural design of field plate electrode 501 is enhanced.

In addition, for example, as illustrated in FIG. 15, the distance between first barrier layer 401a and field plate electrode 502 may be shorter than distance d2 between second barrier layer 402b and field plate electrode 502. The same is true in Embodiment 1, and the distance between first barrier layer 401a and field plate electrode 501 may be shorter than the distance between second barrier layer 401b and field plate electrode 501. With the configuration described above, since the distance between second barrier layer 401b and drain electrode 302 increases, it is possible to reduce the electrostatic capacitance between drain electrode 302 and gate electrode 401.

In addition, for example, as illustrated in FIG. 17, distance d3 between first barrier layer 401a and field plate electrode 502 may be longer than the distance between second barrier layer 402b and field plate electrode 502. The same is true in Embodiment 1, and the distance between first barrier layer 401a and field plate electrode 501 may be longer than the distance between second barrier layer 402b and field plate electrode 501. With the configuration described above, the width of gate electrode 401 is enlarged on the drain electrode 302 side, and thus it is possible to reduce the wiring resistance of gate electrode 401. In addition, since the shape of field plate electrode 501 is flattened, it is possible to reduce the electrostatic capacitance between field plate electrode 501 and gate electrode 401.

In addition, for example, within the essence of the present disclosure, forms obtained by various modifications to the exemplary embodiment that can be conceived by a person of skill in the art as well as forms realized by arbitrarily combining structural elements and functions in the exemplary embodiment which are within the scope of the essence of the present disclosure are included in the present disclosure.

Various changes, substitutions, additions, omissions, and so on, can be carried out in the above-described embodiments within the scope of the claims or its equivalents.

INDUSTRIAL APPLICABILITY

The semiconductor device according to the present disclosure is useful for power switching devices, etc. for use in communication devices, inverters, and power supply circuits that require high-speed operation.

The invention claimed is:
1. A semiconductor device comprising:
a substrate;
a first nitride semiconductor layer disposed above the substrate;
a second nitride semiconductor layer disposed above the first nitride semiconductor layer, the second nitride semiconductor layer having a larger band gap than a band gap of the first nitride semiconductor layer;
a first insulating layer disposed above the second nitride semiconductor layer;
a source electrode and a drain electrode spaced apart from each other, the source electrode and the drain electrode each penetrating through the first insulating layer and being electrically connected to the first nitride semiconductor layer;
an opening portion provided in the first insulating layer between the source electrode and the drain electrode to expose the second nitride semiconductor layer; and
a gate electrode spaced apart from the source electrode and the drain electrode, the gate electrode being in contact with the second nitride semiconductor layer in the opening portion, wherein
the gate electrode includes:
a first barrier layer including TaN and having a layer thickness of Z1, the first barrier layer being a layer that forms a Schottky junction with the second nitride semiconductor layer;

a second barrier layer disposed above and in contact with the first barrier layer, the second barrier layer including TiN or WN and having a layer thickness of Z2; and a wiring layer disposed above and in contact with the second barrier layer, and 200 nm≥Z1+Z2≥50 nm, Z1<Z2, and 50 nm>Z1>3 nm are satisfied.

2. The semiconductor device according to claim 1, wherein
Z1+Z2≥70 nm is satisfied.

3. The semiconductor device according to claim 2, wherein
Z1>10 nm is satisfied.

4. The semiconductor device according to claim 2, wherein
the first barrier layer and the second barrier layer diverge at a divergent point on a path from the opening portion toward the drain electrode,
the semiconductor device comprises:
a second insulating layer extending above the first barrier layer and the first insulating layer, between the divergent point and the drain electrode, the second insulating layer having an oxygen content of 1% or less; and
a field plate electrode disposed above the second insulating layer, between the opening portion and the drain electrode, the field plate electrode being at an electric potential identical to an electric potential of the source electrode, and
a closest distance between the field plate electrode and the gate electrode is at least 100 nm and at most 1000 nm.

5. The semiconductor device according to claim 4, wherein
at least one of the first barrier layer or the second barrier layer has an extension length in a direction from a center of the opening portion toward the source electrode that is different from an extension length in a direction from the center of the opening portion toward the drain electrode.

6. The semiconductor device according to claim 5, wherein
in a plan view of the substrate, a distance between the first barrier layer and the field plate electrode is shorter than a distance between the second barrier layer and the field plate electrode.

7. The semiconductor device according to claim 5, wherein
in a plan view of the substrate, a distance between the first barrier layer and the field plate electrode is longer than a distance between the second barrier layer and the field plate electrode.

8. The semiconductor device according to claim 1, wherein
Z1>10 nm is satisfied.

9. The semiconductor device according to claim 8, wherein
the first barrier layer and the second barrier layer diverge at a divergent point on a path from the opening portion toward the drain electrode,
the semiconductor device comprises:
a second insulating layer extending above the first barrier layer and the first insulating layer, between the divergent point and the drain electrode, the second insulating layer having an oxygen content of 1% or less; and
a field plate electrode disposed above the second insulating layer, between the opening portion and the drain electrode, the field plate electrode being at an electric potential identical to an electric potential of the source electrode, and
a closest distance between the field plate electrode and the gate electrode is at least 100 nm and at most 1000 nm.

10. The semiconductor device according to claim 1, wherein
the first barrier layer and the second barrier layer diverge at a divergent point on a path from the opening portion toward the drain electrode,
the semiconductor device comprises:
a second insulating layer extending above the first barrier layer and the first insulating layer, between the divergent point and the drain electrode, the second insulating layer having an oxygen content of 1% or less; and
a field plate electrode disposed above the second insulating layer, between the opening portion and the drain electrode, the field plate electrode being at an electric potential identical to an electric potential of the source electrode, and
a closest distance between the field plate electrode and the gate electrode is at least 100 nm and at most 1000 nm.

11. The semiconductor device according to claim 10, wherein
in a direction perpendicular to an upper surface included in the substrate, a lowermost surface position of the field plate electrode is below a lower end position of a side surface of the second barrier layer located closest to the drain electrode.

12. The semiconductor device according to claim 10, wherein
the field plate electrode partially includes a material identical to a material of the second barrier layer.

13. The semiconductor device according to claim 10, wherein
in a direction perpendicular to an upper surface included in the substrate, an uppermost surface position of the field plate electrode is below a lower end position of a side surface of the second barrier layer located closest to the drain electrode.

14. The semiconductor device according to claim 10, wherein
the field plate electrode includes a plurality of layers including a lower layer and an upper layer, the upper layer having a resistivity smaller than a resistivity of the lower layer.

15. The semiconductor device according to claim 10, further comprising:
a third insulating layer disposed above the second insulating layer between the divergent point and the drain electrode, the third insulating layer covering the field plate electrode, wherein
the second insulating layer and the third insulating layer are sandwiched between the first barrier layer and the second barrier layer.

16. The semiconductor device according to claim 15, wherein
a permittivity of a material included in the third insulating layer is lower than a permittivity of a material included in the second insulating layer.

17. The semiconductor device according to claim 16, wherein
the second insulating layer has a layer thickness smaller than a layer thickness of the third insulating layer.

18. The semiconductor device according to claim 10, wherein at least one of the first barrier layer or the second barrier layer has an extension length in a direction from a center of the opening portion toward the source electrode that is different from an extension length in a direction from the center of the opening portion toward the drain electrode.

19. The semiconductor device according to claim 18, wherein
in a plan view of the substrate, a distance between the first barrier layer and the field plate electrode is shorter than a distance between the second barrier layer and the field plate electrode.

20. The semiconductor device according to claim 18, wherein
in a plan view of the substrate, a distance between the first barrier layer and the field plate electrode is longer than a distance between the second barrier layer and the field plate electrode.

* * * * *